US012794355B2

(12) United States Patent
Lim et al.

(10) Patent No.: US 12,794,355 B2
(45) Date of Patent: Nov. 10, 2026

(54) POWER MANAGEMENT INTEGRATED CIRCUIT AND STORAGE DEVICE INCLUDING POWER MANAGEMENT INTEGRATED CIRCUIT AND METHOD OF MANAGING POWER THEREOF

(71) Applicant: Samsung Electronics Co., Ltd., Suwon-si (KR)

(72) Inventors: Hyoungtaek Lim, Suwon-si (KR); Ho-Jin Chun, Suwon-si (KR); Jong-Wook Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/235,673

(22) Filed: Jun. 12, 2025

(65) Prior Publication Data

US 2026/0155739 A1 Jun. 4, 2026

(30) Foreign Application Priority Data

Dec. 2, 2024 (KR) ........................ 10-2024-0176914

(51) Int. Cl.
*H02M 1/32* (2007.01)
*G11C 16/04* (2006.01)
(Continued)

(52) U.S. Cl.
CPC ......... *H02M 1/325* (2021.05); *G11C 16/0483* (2013.01); *G11C 16/30* (2013.01); *H02M 3/158* (2013.01); *G11C 16/08* (2013.01)

(58) Field of Classification Search
CPC ... H02M 1/325; H02M 3/158; G11C 16/0483; G11C 16/30; G11C 16/08
See application file for complete search history.

(56) References Cited

U.S. PATENT DOCUMENTS 6,873,191 B2 3/2005 Dequina et al.
9,543,822 B2 1/2017 Hang et al.
(Continued)

FOREIGN PATENT DOCUMENTS

KR 20-0172696 Y1 3/2000
KR 10-2012-0127937 A 11/2012
(Continued)

*Primary Examiner* — Jason W Blust
(74) *Attorney, Agent, or Firm* — Muir Patent Law, PLLC

(57) ABSTRACT

A power management integrated circuit includes a DC-DC converter configured to generate an internal voltage and output an internal power supply voltage based on the internal voltage. The DC-DC converter includes a first switch connected between an external power supply voltage and a second node from which the internal voltage is output, a second switch connected between the second node and a ground, and a third switch connected between the second node and the external power supply voltage through a resistor. When the internal voltage is a normal voltage, the DC-DC converter generate the internal voltage having a level between a first voltage and a second voltage lower than the first voltage by repeatedly turning on and off the first and second switches. When the internal voltage exceeds the first voltage, the DC-DC converter decreases the internal voltage by repeatedly turning on and off the second and third switches.

20 Claims, 15 Drawing Sheets

(51) Int. Cl.
*G11C 16/08* (2006.01)
*G11C 16/30* (2006.01)
*H02M 3/158* (2006.01)

(56) References Cited

U.S. PATENT DOCUMENTS

| | | | |
|---|---|---|---|
| 9,887,638 B2 | 2/2018 | Norimatsu et al. | |
| 2017/0331371 A1* | 11/2017 | Parto | G05F 1/46 |
| 2021/0313887 A1* | 10/2021 | Mariani | H02M 3/158 |
| 2022/0006382 A1* | 1/2022 | Wu | H02M 3/07 |
| 2022/0321008 A1* | 10/2022 | Choi | H02M 3/158 |
| 2022/0407345 A1 | 12/2022 | Seo et al. | |
| 2023/0040473 A1 | 2/2023 | Gu et al. | |
| 2024/0113622 A1* | 4/2024 | Yokoyama | B60R 16/03 |

FOREIGN PATENT DOCUMENTS

| | | | |
|---|---|---|---|
| KR | 10-1493063 B1 | 2/2015 | |
| KR | 10-2065576 B1 | 1/2020 | |
| KR | 10-2021-0129561 A | 10/2021 | |

* cited by examiner

POWER MANAGEMENT INTEGRATED CIRCUIT AND STORAGE DEVICE INCLUDING POWER MANAGEMENT INTEGRATED CIRCUIT AND METHOD OF MANAGING POWER THEREOF

CROSS-REFERENCE TO RELATED APPLICATION(S)

This application claims priority under 35 U.S.C. § 119 to Korean Patent Application No. 10-2024-0176914 filed on Dec. 2, 2024, in the Korean Intellectual Property Office, the disclosures of which are incorporated by reference herein in their entireties.

BACKGROUND

1. Field

Example embodiments of the present disclosure described herein relate to a semiconductor memory device, and more particularly, relate to a storage device including the power management integrated circuit and a power management integrated circuit, and a power management method of the storage device.

2. Description of Related Art

A semiconductor memory may be mainly classified as a volatile memory or a non-volatile memory. Read and write speeds of the volatile memory are fast, but the data stored in the volatile memory disappear when a power is turned off. In contrast, the non-volatile memory may retain data even when the power is turned off. Therefore, the non-volatile memory may be used to store contents that must be preserved regardless of whether power is supplied or not.

A representative example of the non-volatile memory is a flash memory. The flash memory is widely used as a storage medium for audio and video data in information devices such as a computer and a smartphone. Recently, high-capacity, high-speed input/output and low-power technologies for the flash memory are being actively researched for installation in mobile devices such as the smartphone.

The storage device may use a volatile memory device as a temporary storage together with a nonvolatile memory device to improve read or write performance. The storage device may use a power management integrated circuit to supply power to the volatile memory device and the non-volatile memory device. However, when the power management integrated circuit immediately cuts off power to protect internal circuits upon a temporary rise of an internal voltage, data temporarily stored only in the volatile memory device may be lost. Therefore, when the internal voltage rises abnormally, the power management integrated circuit may need to keep providing power which is reduced.

SUMMARY

Example embodiments of the present disclosure provide a storage device including a power management integrated circuit which does not immediately cut off power upon a temporary rise of an internal voltage but gradually adjusts the increased internal voltage to a specified voltage.

According to an example embodiment, a power management integrated circuit includes a DC-DC converter configured to generate an internal intermediate voltage based on an external power supply voltage and output an internal power supply voltage based on the internal intermediate voltage. The DC-DC converter includes a first switch connected between a first node to which the external power supply voltage is applied and a second node from which the internal intermediate voltage is output, and configured to repeatedly turn on and off based on a first switching signal, a second switch connected between the second node and a ground node, and configured to repeatedly turn on and off based on a second switching signal, a resistor connected between the first node and a third node, a third switch connected between the third node and the second node, and configured to repeatedly turn on and off based on a third switching signal, a pulse width modulation control circuit configured generate the first to third switching signals based on a level of the internal intermediate voltage, and a voltage distribution circuit connected between the second node and a fourth node, and configured to output the internal power supply voltage from the fourth node based on the internal intermediate voltage. When the internal intermediate voltage is lower than or equal to a first reference voltage, the DC-DC converter is configured to generate the internal intermediate voltage having a level between the first reference voltage and a second reference voltage lower than the first reference voltage by repeatedly turning on and off the first and second switches in response to activation of the first and second switching signals and turning off the third switch in response to deactivation of the third switching signal. When the internal intermediate voltage exceeds the first reference voltage, the DC-DC converter is configured to decrease the internal intermediate voltage to the second reference voltage by repeatedly turning on and off the second and third switches in response to activation of the second and third switching signals and turning off the first switch in response to deactivation of the first switching signal.

According to an example embodiment, a storage device includes a nonvolatile memory device including a plurality of memory cells, a volatile memory device temporarily storing data stored in the plurality of memory cells of the nonvolatile memory device, a memory controller configured to transfer the data between the nonvolatile memory device and the volatile memory device, and a power management integrated circuit configured to generate an internal intermediate voltage and output an internal power supply voltage to at least one of the nonvolatile memory device, the volatile memory device and the memory controller based on the internal intermediate voltage. The power management integrated circuit includes a DC-DC converter. The DC-DC converter includes a first switch connected between a first node to which an external power voltage is applied and a second node from which the internal intermediate voltage is output, and configured to turn on and off based on a first switching signal, a second switch connected between the second node and a ground node, and configured to turn on and off based on a second switching signal, a resistor connected between the first node and a third node, a third switch connected between the third node and the second node, and configured to turn on and off based on a third switching signal, a pulse width modulation control circuit configured to generate the first to third switching signals based on a level of the internal intermediate voltage, and a voltage distribution circuit connected between the second node and a fourth node, and configured to output the internal power supply voltage from the fourth node based on the internal intermediate voltage. When the internal intermediate voltage is lower than or equal to a first reference voltage, the DC-DC converter is configured to generate the internal intermediate voltage having a level between the first reference voltage and a second reference voltage lower than the first reference voltage by repeatedly turning on and off the first and second switches in response to activation of the first and second switching signals and turning off the third switch in response to deactivation of the third switching signal. When the internal intermediate voltage exceeds the first reference voltage, the DC-DC converter is configured to decrease the internal intermediate voltage to the second reference voltage by repeatedly turning on and off the second and third switches in response to activation of the second and third switching signals and turning off the first switch in response to deactivation of the first switching signal.

According to an example embodiment, a power management method of a storage device includes generating an internal intermediate voltage having a level between a first reference voltage and a second reference voltage lower than the first reference voltage by repeatedly turning on and off a first switch connected to an external power supply voltage and repeatedly turning on and off a second switch connected to a ground voltage, when the internal intermediate voltage exceeds the first reference voltage, decreasing the internal intermediate voltage by repeatedly turning on and off the second switch and a third switch connected to the external power supply voltage through a resistor and by turning off the first switch, when the internal intermediate voltage is decreased to the second reference voltage, generating the internal intermediate voltage again having the level by repeatedly turning on and off the first switch and the second switch and by turning off the third switch, and generating an internal power supply voltage based on the internal intermediate voltage and outputting the internal power supply voltage to at least one of a nonvolatile memory device, a volatile memory device and a memory controller. The generating of the internal intermediate voltage is performed based on the external power supply voltage and a level of the internal intermediate voltage.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure will be described in detail and clearly to such an extent that an ordinary one in the art easily implements the inventive concepts.

Figure 1:
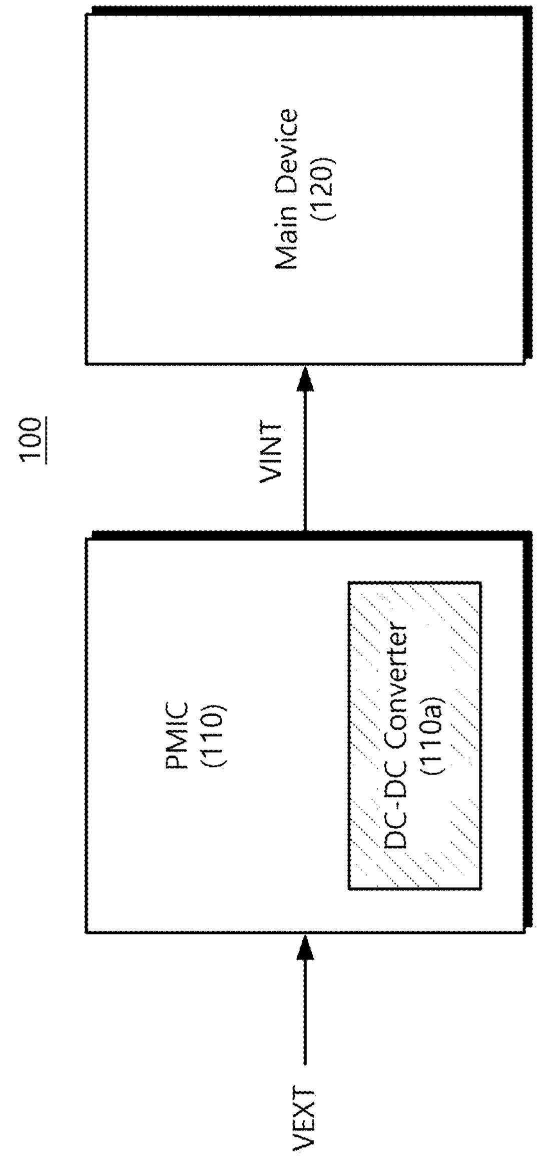
FIG. 1 is a block diagram illustrating a user device according to an example embodiment.

FIG. 1 is a block diagram illustrating a user device according to an example embodiment. Referring to FIG. 1, a user device 100 may include a power management integrated circuit (PMIC) 110 and a main device 120.

The power management integrated circuit 110 may receive an external power supply voltage VEXT. The power management integrated circuit 110 may provide an internal power supply voltage VINT to the main device 120 based on the external power supply voltage VEXT. The external power supply voltage VEXT and the internal power supply voltage VINT may be direct current (DC) power voltages.

For example, the power management integrated circuit 110 may include a DC-DC converter 110*a*. The DC-DC converter 110*a* may generate an internal intermediate voltage based on the external power supply voltage VEXT.

The power management integrated circuit 110 may generate an internal power supply voltage VINT required for the main device 120 based on the internal intermediate voltage. For example, the DC-DC converter 110*a* of the power management integrated circuit 110 may include a voltage distribution circuit. The voltage distribution circuit may output the internal power supply voltage VINT based on the internal intermediate voltage.

The main device 120 may include various electronic devices. For example, the main device 120 may include a storage device (for example, a dynamic random access memory (DRAM), a solid state drive (SSD), a universal flash storage (UFS), a memory card, or the like). The main device 120 may perform an operation based on the internal power supply voltage VINT.

Although one main device 120 is illustrated as an example in FIG. 1, the user device 100 may include a plurality of main devices 120. In some example embodiments that include a plurality of main devices 120, the power management integrated circuit 110 may generate a plurality of internal power supply voltages VINT (for example, a first internal power supply voltage, a second internal power supply voltage, and the like) corresponding to each of the plurality of main devices 120.

As an example, the power management integrated circuit 110 may generate one internal intermediate voltage through the DC-DC converter 110*a* and generate one internal power supply voltage VINT through the voltage distribution circuit of the DC-DC converter 110*a*. As another example, the power management integrated circuit 110 may include a plurality of DC-DC converters 110*a* corresponding to a plurality of internal power supply voltages VINT.

Figure 2:
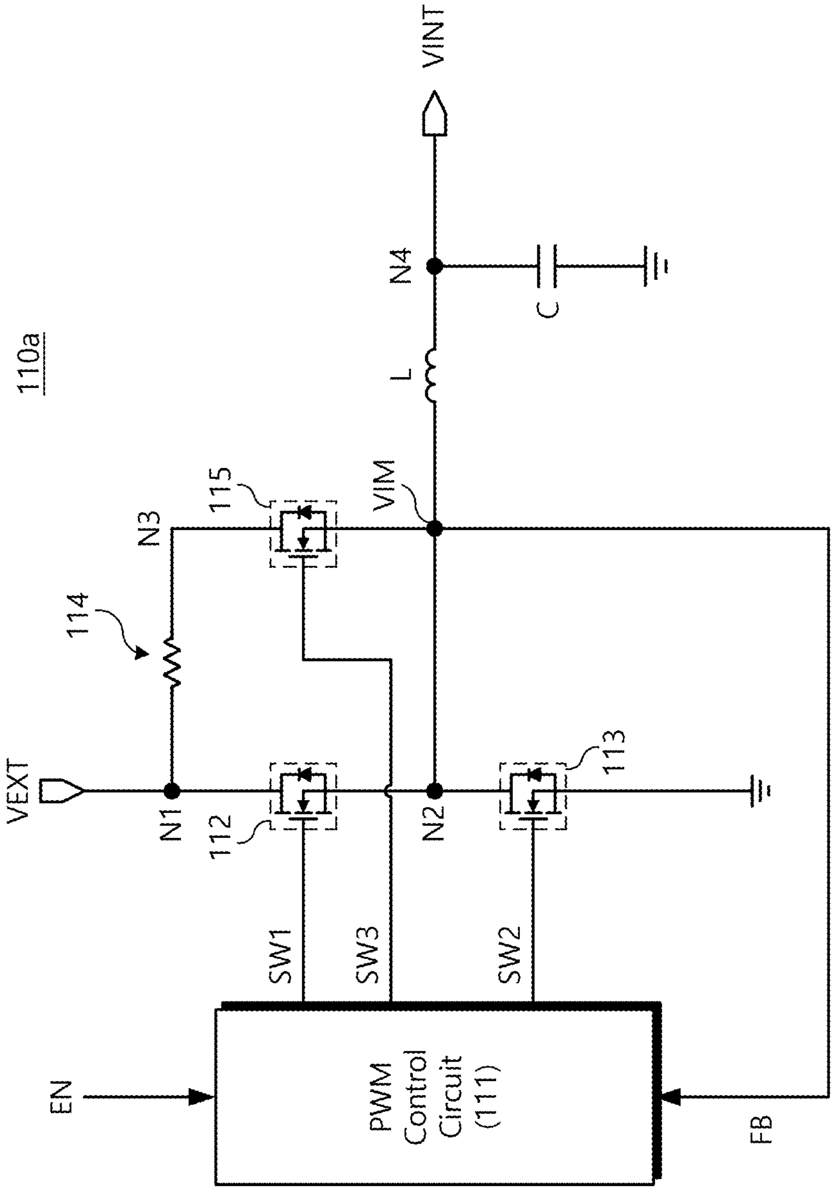
FIG. 2 is a diagram illustrating a DC-DC converter of a power management integrated circuit of FIG. 1 according to an example embodiment.

FIG. 2 is a diagram illustrating the DC-DC converter 110*a* of the power management integrated circuit 110 of FIG. 1 according to an example embodiment. Referring to FIG. 2, the DC-DC converter 110*a* may include a pulse width modulation (PWM) control circuit 111 and a plurality of switches. Each of the plurality of switches may be configured as a metal-oxide-semiconductor field-effect transistor (MOSFET). As an example, in FIG. 2, a first switch 112, a second switch 113 and a third switch 115 are illustrated as N-type MOSFETs. However, this is exemplary, and the first switch 112, the second switch 113 and/or the third switch 115 may be configured as N-type MOSFETs or P-type MOSFETs.

The first switch 112 may be connected between a first node N1 and a second node N2. For example, the first switch 112 may include a drain connected to the first node N1, a source connected to the second node N2, and a gate to which the first switching signal SW1 is input. The first switch 112 may be repeatedly turned on and off based on a first switching signal SW1. The first switch 112 may increase a voltage (for example, an internal intermediate voltage VIM) of the second node N2 based on a voltage (for example, an external power supply voltage VEXT) of the first node N1.

The second switch 113 may be connected between the second node N2 and a ground node. For example, the second switch 113 may include a drain connected to the second node N2, a source connected to the ground node, and a gate to which the second switching signal SW2 is input. Herein, for convenience of description, the terms of the ground node, a ground, and a ground voltage may be used interchangeably. The second switch 113 may be repeatedly turned on and off based on a second switching signal SW2. The second switch 113 may operate complementarily with the first switch 112. In this case, the second switching signal SW2 may be complementary to the first switching signal SW1. The second switch 113 may lower the voltage (for example, the internal intermediate voltage VIM) of the second node N2 based on the ground voltage.

The pulse width modulation control circuit 111 may start a power management operation based on an enable signal EN. For example, in a normal state, the pulse width modulation control circuit 111 may output or activate the first switching signal SW1 and the second switching signal SW2. For example, the DC-DC converter 110*a* may output the internal intermediate voltage VIM by repeatedly turning on and off the first and second switches 112 and 113 based on activation of the first switching signal SW1 and the second switching signal SW2. The DC-DC converter 110*a* of the power management integrated circuit 110 may output the internal intermediate voltage VIM specified based on the external power supply voltage VEXT.

The pulse width modulation control circuit 111 may receive the internal intermediate voltage VIM as a feedback signal FB. The pulse width modulation control circuit 111 may compare the internal intermediate voltage VIM with a reference voltage (not shown). When the internal intermediate voltage VIM rises above the reference voltage, the pulse width modulation control circuit 111 may turn off the first switch 112 based on deactivation of the first switch signal SW1 and turn on the second and third switches 113 and 115 based on activation of the second and third switch signals SW2 and SW3.

The third switch 115 may be connected to the first node N1 through a resistor 114. The resistor 114 may be connected between the first node N1 and a third node N3. For example, the third switch 115 may include a drain connected to the third node N3, a source connected to the second node N2, and a gate to which the third switching signal SW3 is input. The third switch 115 may be connected between the third node N3 and the second node N2. The third switch 115 may be repeatedly turned on and off based on the third switching signal SW3. The third switch 115 may increase the voltage (for example, the internal intermediate voltage VIM) of the second node N2 based on a voltage of the third node N3. The third switch 115 may operate complementarily with the second switch 113. In this case, the third switching signal SW3 may be complementary to the second switching signal SW2. For example, a current flowing capacity of the third switch 115 may be equal to or smaller than a current flowing capacity of the first switch 112.

A current flowing through the third switch 115 may be smaller than a current flowing through the first switch 112 due to the resistor 114. For example, when the internal intermediate voltage VIM rises above a first reference voltage (e.g., Vref1 of FIG. 3), the internal intermediate voltage VIM may gradually decrease below the first reference voltage by turning off the first switch 112 and repeatedly turning on and off the second and third switches 113 and 115. The pulse width modulation control circuit 111 may turn off the third switch 115 and turn on the first switch 112 again when the internal intermediate voltage VIM reaches a normal voltage (e.g., Vref2 of FIG. 3).

Therefore, when the internal intermediate voltage VIM rises abnormally, the DC-DC converter 110*a* may control an output of the internal intermediate voltage VIM to gradually return to the normal voltage without interrupting the output of the internal intermediate voltage VIM. The power management integrated circuit 110 may supply the internal power supply voltage VINT to the main device 120 without interrupting the internal power supply voltage VINT based on the internal intermediate voltage VIM.

In example embodiments, the DC-DC converter 110*a* may further include the voltage distribution circuit. For example, the voltage distribution circuit may include an LC filter. The LC filter may include an inductor L and a capacitor C connected to each other. For example, a first end of the inductor L may be connected to the second node N2 from which the internal intermediate voltage VIM is output and a second end of the inductor L may be connected to a fourth node N4 from which the internal power supply voltage VINT is output. A first end of the capacitor C may be connected to the fourth node N4 and a second end of the capacitor C may be connected to the ground. For example, the voltage distribution circuit may receive the internal intermediate voltage VIM at the second node N2 and may output the internal power supply voltage VINT from the fourth node N4. However, the inventive concept is not limited thereto. For example, the LC filter may include a plurality of inductors L and a plurality of capacitors C connected to each other. In example embodiments, the LC filter of the voltage distribution circuit may be installed outside the power management integrated circuit 110. For example, the power management integrated circuit 110 may be implemented as a single package, while the LC filter of the voltage distribution circuit is disposed separately from the package.

In example embodiments, the LC filter of the voltage distribution circuit may be located outside the power management integrated circuit 110. In this case, the power management integrated circuit 110 may output the internal intermediate voltage VIM through the DC-DC converter

110*a* to the LC filter, and the LC filter may output the internal power supply voltage VINT to the main device 120 based on the internal intermediate voltage VIM.

Figure 3:
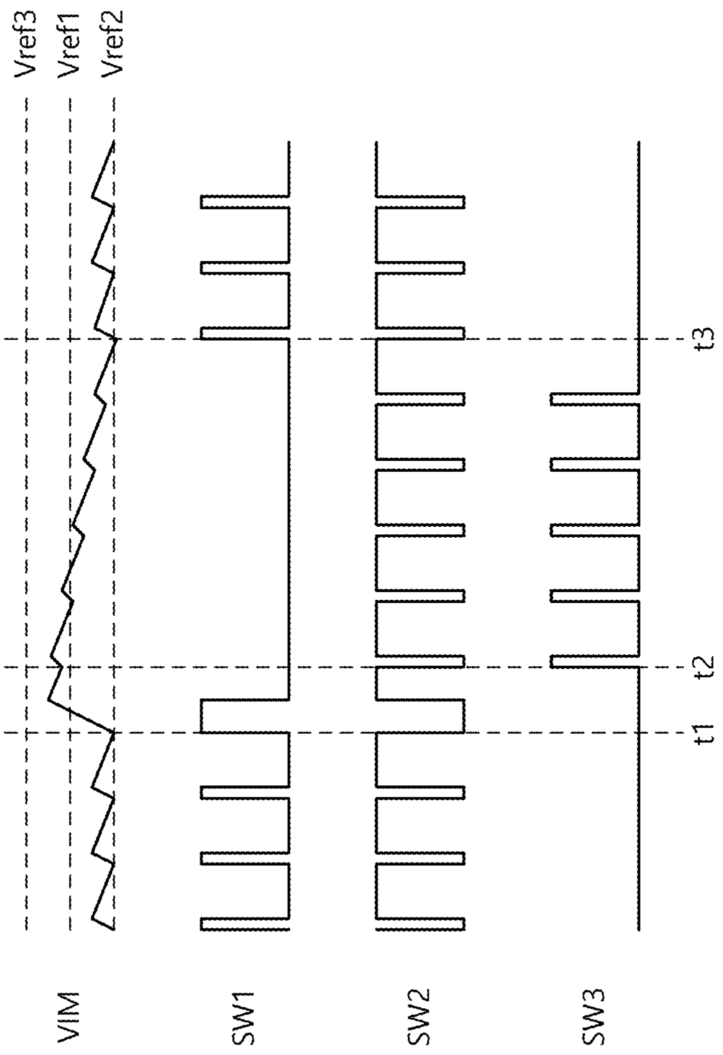
FIG. 3 is a timing diagram illustrating an operation of the DC-DC converter of FIG. 2 according to an example embodiment.

FIG. 3 is a timing diagram illustrating an operation of the DC-DC converter 110*a* of FIG. 2 according to an example embodiment. Referring to FIGS. 2 and 3, the DC-DC converter 110*a* may control the output of the internal intermediate voltage VIM to gradually reach the normal voltage without interrupting the output of the internal intermediate voltage VIM when the internal intermediate voltage VIM rises abnormally. The normal voltage may be a second reference voltage Vref2. For example, the internal power supply voltage VINT may have a specific level when the internal intermediate voltage VIM is in a range between a first reference voltage Vref1 and the second reference voltage Vref2 lower than the first reference voltage Vref1.

Before a first time point t1, the pulse width modulation control circuit 111 may output or activate the first switching signal SW1 and the second switching signal SW2 based on a first duty ratio. In this case, the second switching signal SW2 may be complementary to the first switching signal SW1. Accordingly, the internal intermediate voltage VIM may maintain a voltage below the first reference voltage Vref1 and above the second reference voltage Vref2 before the first time point t1. For example, the DC-DC converter 110*a* may perform a pulse width modulation operation by repeatedly turning on and off the first and second switches 112 and 113 based on activation of the first and second switching signals SW1 and SW2, and by turning off the third switch 115 based on deactivation of the third switching signal SW3.

From the first time point t1, the internal intermediate voltage VIM may increase and exceed the first reference voltage Vref1 due to various causes (for example, duty ratio fluctuation of the first switching signal SW1). As an example, when a duty ratio of the first switching signal SW1 increases, the internal intermediate voltage VIM may increase.

At a second time point t2, when the internal intermediate voltage VIM exceeds the first reference voltage Vref1, the pulse width modulation control circuit 111 may stop or deactivate the first switching signal SW1 and output or activate the second and third switching signals SW2 and SW3. In this case, the second switching signal SW2 may be complementary to the third switching signal SW3. Accordingly, the DC-DC converter 110*a* may perform the pulse width modulation operation with a second duty ratio by turning off the first switch 112 based on deactivation of the first switching signal SW1, and repeatedly turning on and off the second and third switches 113 and 115 based on activation of the second and third switching signals SW2 and SW3. Therefore, the internal intermediate voltage VIM may gradually decrease below the first reference voltage Vref1 from the second time point t2.

At a third time point t3, when the internal intermediate voltage VIM is decreased to the second reference voltage Vref2, the pulse width modulation control circuit 111 may stop or deactivate the third switching signal SW3 and output or activate the first and second switching signals SW1 and SW2 again. In this case, the second switching signal SW2 may be complementary to the first switching signal SW1. Accordingly, the DC-DC converter 110*a* may perform again the pulse width modulation operation with the first duty ratio by turning off the third switch 115 and repeatedly turning on and off the first and second switches 112 and 113. For example, the internal intermediate voltage VIM may maintain the voltage below the first reference voltage Vref1 and above the second reference voltage Vref2 after the third time point t3.

According to an example embodiment, when the internal intermediate voltage VIM exceeds a third reference voltage Vref3 greater than the first reference voltage Vref1, the pulse width modulation control circuit 111 may block or deactivate all switching signals to protect the power management integrated circuit 110 and/or the main device 120.

Figure 4:
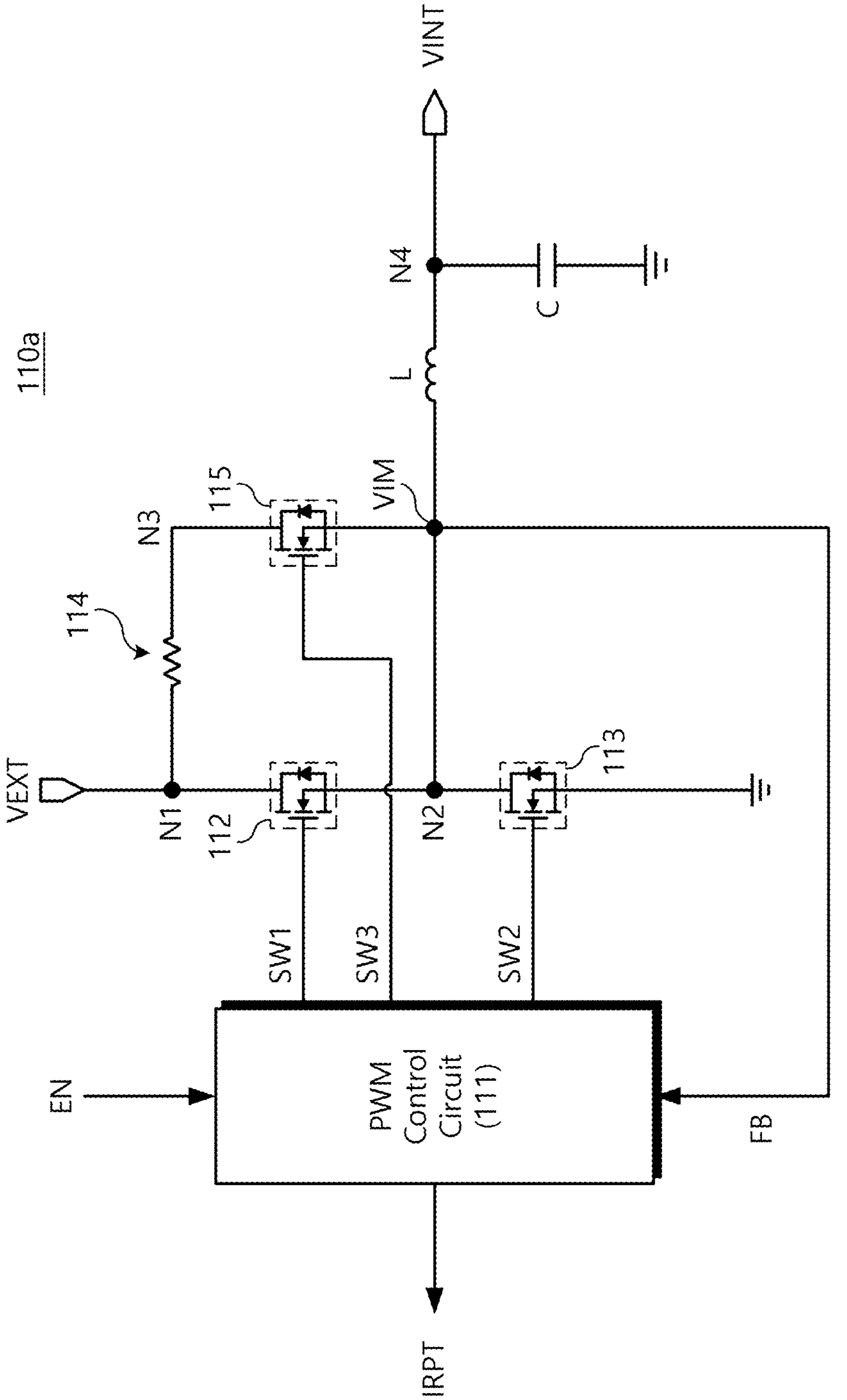
FIG. 4 is a diagram illustrating the DC-DC converter of the power management integrated circuit of FIG. 1.
Figure 5:
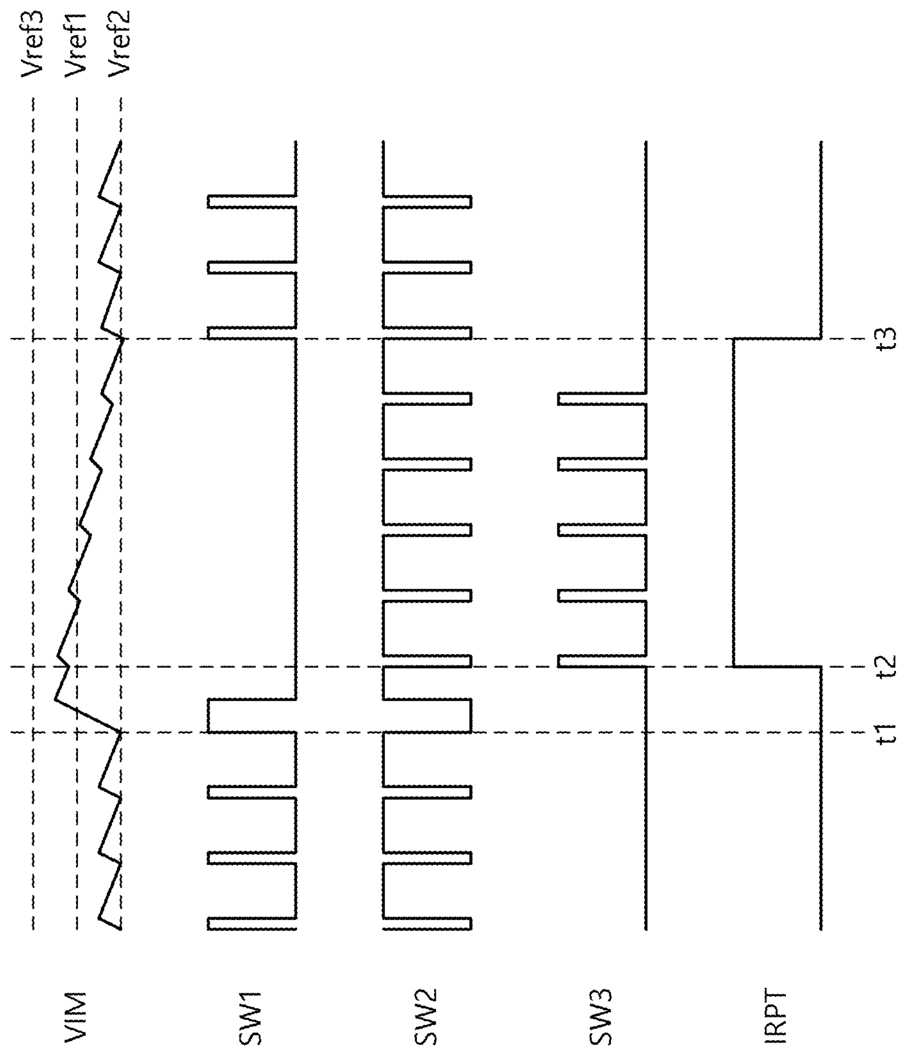
FIG. 5 is a timing diagram illustrating an operation of the DC-DC converter of FIG. 4 according to an example embodiment.

FIG. 4 is a diagram illustrating another example embodiment of the DC-DC converter 110*a* of the power management integrated circuit 110 of FIG. 1. FIG. 5 is a timing diagram illustrating an operation of the DC-DC converter 110*a* of FIG. 4 according to an example embodiment. In FIG. 4, the first switch 112, the second switch 113, the third switch 115, and the resistor 114 of the DC-DC converter 110*a* are identical to those described with reference to FIG. 2, and thus descriptions identical to those given above with reference to are omitted.

Referring to FIGS. 4 and 5, the DC-DC converter 110*a* may transmit an interrupt signal IRPT to an external device (for example, a memory controller 1200 of FIG. 10) when the internal intermediate voltage VIM rises abnormally. In FIG. 5, the timing diagrams of the internal intermediate voltage VIM, the first to third switching signals SW1, SW2 and SW3 are identical to those described with reference to FIG. 3, and thus descriptions identical to those given above with reference to are omitted.

For example, the pulse width modulation control circuit 111 may monitor a feedback signal FB of the internal intermediate voltage VIM. At the second time point t2, when the internal intermediate voltage VIM exceeds the first reference voltage Vref1, the pulse width modulation control circuit 111 may output or activate the interrupt signal IRPT. For example, the DC-DC converter 110*a* may transmit the interrupt signal IRPT to the memory controller (e.g., 1200 of FIG. 10). The memory controller may move data stored in a buffer memory (e.g., 1300 of FIG. 10) to a non-volatile memory (e.g., 1100 of FIG. 10) when the interrupt signal IRPT is received. Accordingly, a storage device (e.g., 1000 of FIG. 10) may prevent a loss of data which is stored only in the buffer memory. At the third time point t3, when the internal intermediate voltage VIM is decreased to the second reference voltage Vref2, the pulse width modulation control circuit 111 may stop or deactivate the interrupt signal IRPT.

Figure 6:
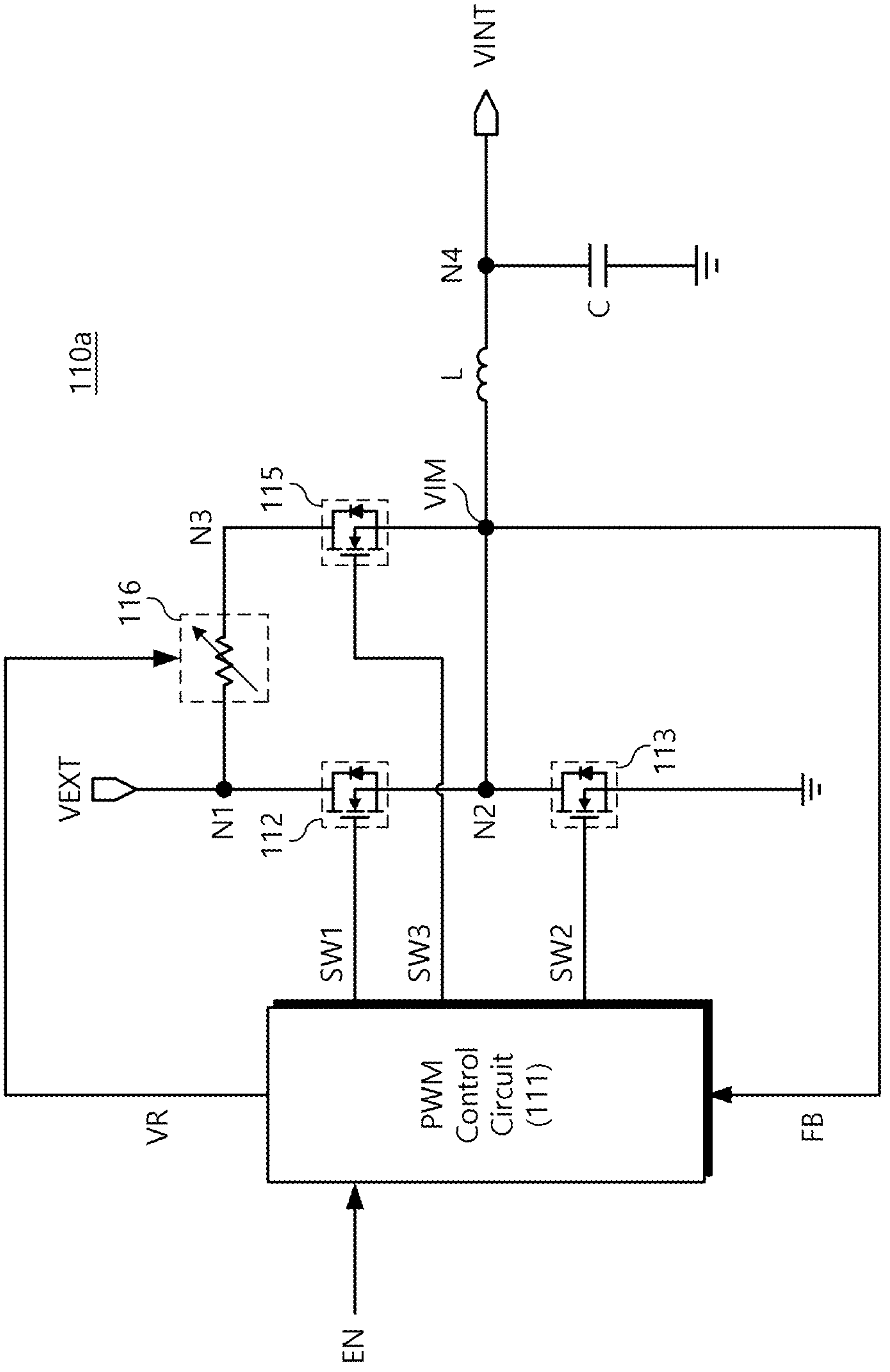
FIG. 6 is a diagram illustrating the DC-DC converter of the power management integrated circuit of FIG. 1 according to an example embodiment.

FIG. 6 is a diagram illustrating the DC-DC converter 110*a* of the power management integrated circuit 110 of FIG. 1. In FIG. 6, the first switch 112, the second switch 113, and the third switch 115 of the DC-DC converter 110*a* are identical to those described with reference to FIG. 2, and thus descriptions identical to those given above with reference to are omitted.

Referring to FIG. 6, the DC-DC converter 110*a* may include a variable resistor 116 connected between the first node N1 and the third node N3. As an example, the variable resistor 116 may be connected between the first node N1 and the third node N3 in place of the resistor 114 of FIG. 4. As another example, the variable resistor 116 may be connected between the first node N1 and the third node N3 in parallel with the resistor 114. In this case, the variable resistor 116 and the resistor 114 may be connected in parallel between the first node N1 and the third node N3.

The pulse width modulation control circuit 111 may output a variable resistor control signal VR which controls a resistance value of the variable resistor 116. The pulse width modulation control circuit 111 may control the variable resistor 116 so that a current flowing through the third switch 115 decreases as a magnitude of the internal intermediate voltage VIM which is fed back increases.

For example, when the internal intermediate voltage VIM exceeds the first reference voltage Vref1, the pulse width modulation control circuit 111 may control the variable resistor 116 to have a first resistance value. When the internal intermediate voltage VIM exceeds the third reference voltage Vref3 greater than the first reference voltage Vref1, the pulse width modulation control circuit 111 may control the variable resistor 116 to have a second resistance value greater than the first resistance value.

Figure 7:
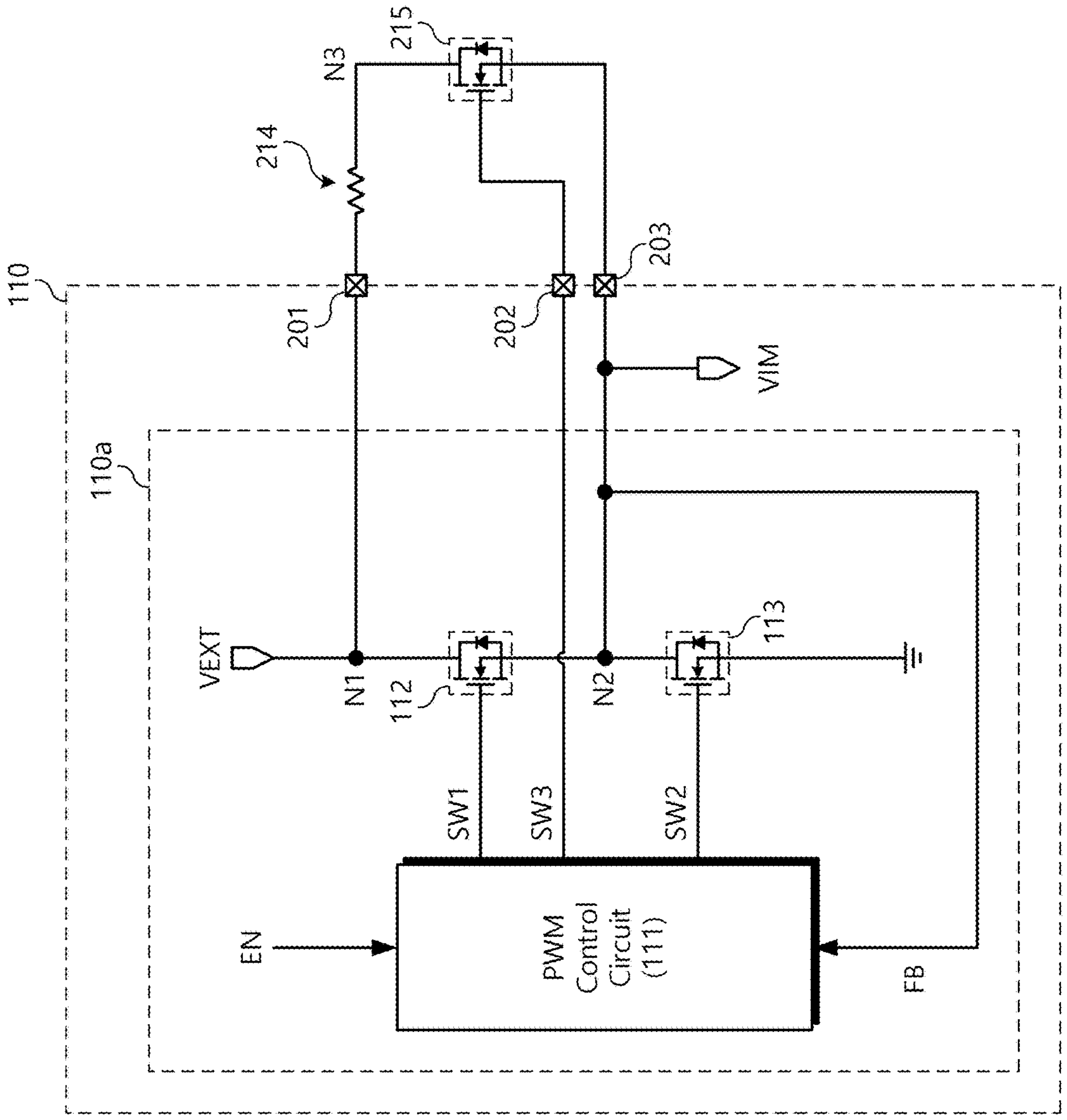
FIG. 7 is a diagram illustrating the DC-DC converter of FIG. 1 according to an example embodiment.

FIG. 7 is a diagram illustrating the DC-DC converter 110*a* of FIG. 1 according to an example embodiment. In FIG. 7, the first switch 112 and the second switch 113 of the DC-DC converter 110*a* are identical to those described with reference to FIG. 2, and thus descriptions identical to those given above with reference to are omitted.

Referring to FIG. 7, a resistor 214 and a third switch 215 may be installed outside the power management integrated circuit 110. In another embodiment, one of the resistor 214 and the third switch 215 may be installed outside the power management integrated circuit 110. The power management integrated circuit 110 may include external ports 201, 202 and 203 connected to the resistor 214 and the third switch 215. Herein, the resistor 214 and the third switch 215 may correspond to the resistor 114 and the third switch 115 of FIG. 2, respectively. The voltage distribution circuit including the LC filter described with reference to FIG. 2 may be disposed outside or inside the power management integrated circuit 110.

Figure 8:
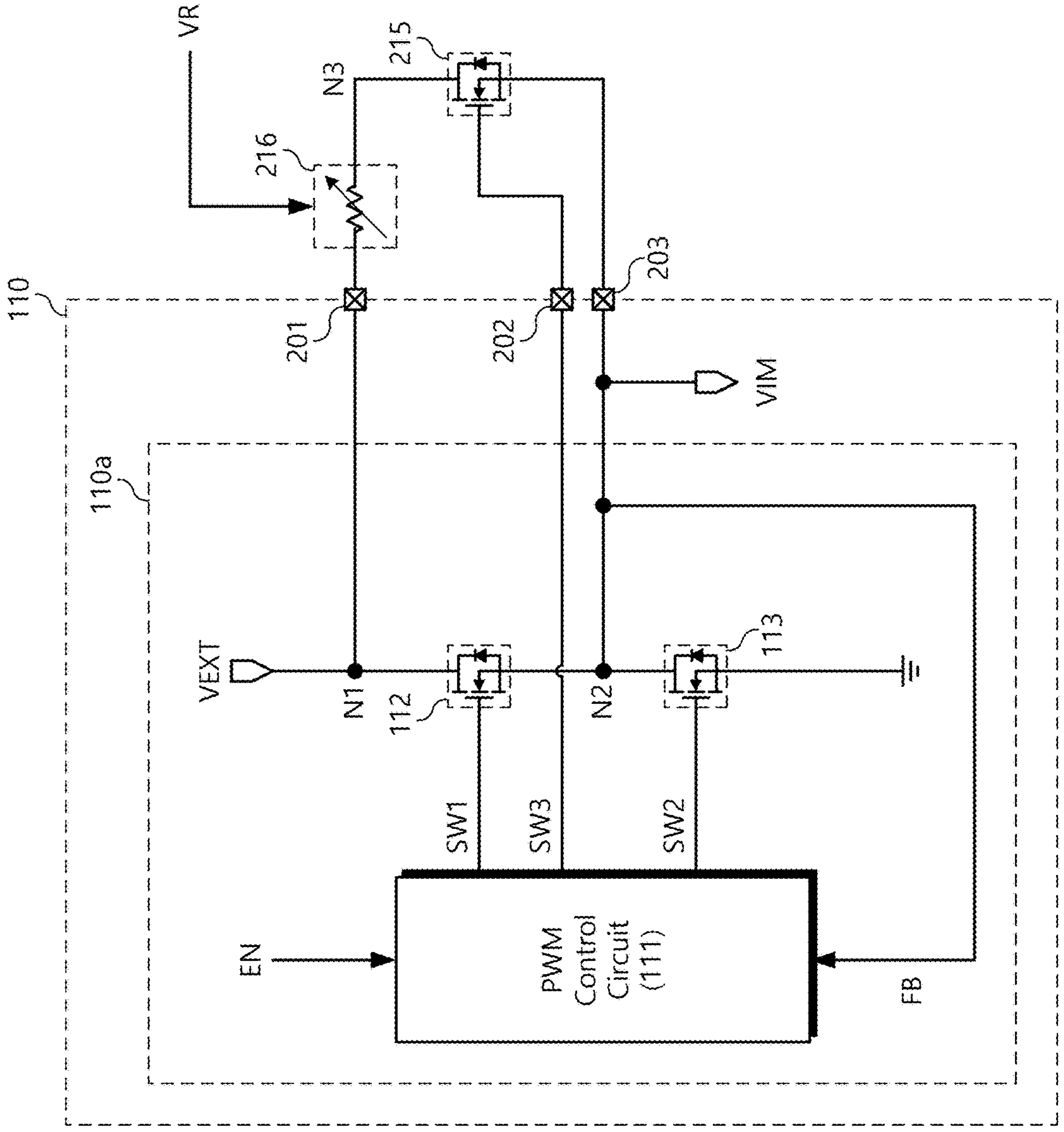
FIG. 8 is a diagram illustrating the DC-DC converter of FIG. 1 according to an example embodiment.

FIG. 8 is a diagram illustrating the DC-DC converter 110*a* of FIG. 1 according to an example embodiment. In FIG. 8, the first switch 112, the second switch 113, and the third switch 215 of the DC-DC converter 110*a* are identical to those described with reference to FIG. 7, and thus descriptions identical to those given above with reference to are omitted.

Referring to FIG. 8, a variable resistor 216 and a third switch 215 may be installed outside the power management integrated circuit 110. In another embodiment, one of the variable resistor 216 and the third switch 215 may be installed outside the power management integrated circuit 110. The power management integrated circuit 110 may include external ports 201, 202 and 203 connected to the variable resistor 216 and the third switch 215. Herein, the third switch 215 may correspond to the third switch 115 of FIG. 6, respectively. A variable resistor control signal VR controlling the variable resistor 216 may be provided from an external device (for example, a memory controller). In an example embodiment, the variable resistor control signal VR may be output from the pulse width modulation control circuit 111.

As an example, the variable resistor 216 may be connected between a first node N1 and a third node N3 in place of the resistor 214 of FIG. 7. As another example, the variable resistor 216 may be connected between the first node N1 and the third node N3 in parallel with the resistor 214. In this case, the variable resistor 216 and the resistor 214 may be connected in parallel between the first node N1 and the third node N3.

Figure 9:
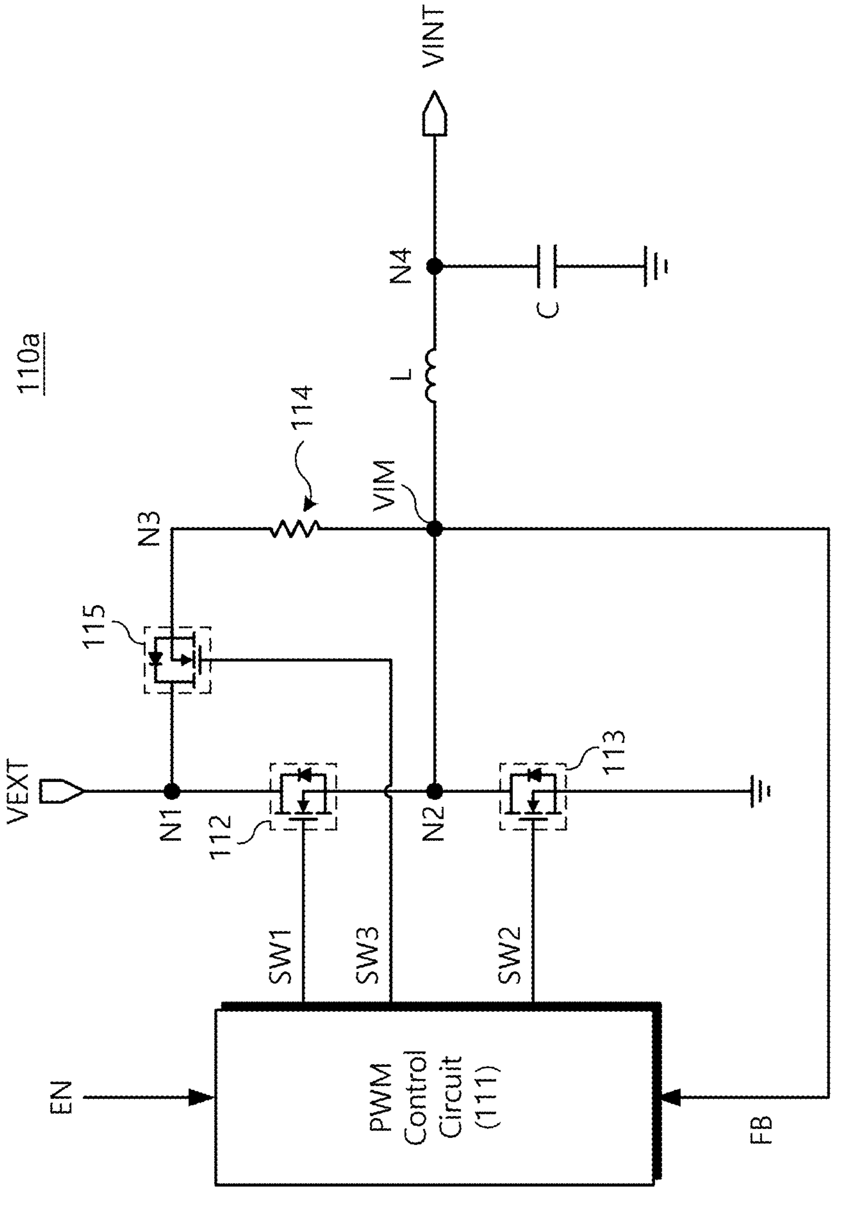
FIG. 9 is a diagram illustrating the DC-DC converter of FIG. 1 according to an example embodiment.

FIG. 9 is a diagram illustrating the DC-DC converter 110*a* of FIG. 1 according to an example embodiment. In FIG. 9, the first switch 112, the second switch 113, and the pulse width modulation control circuit 111 are identical to those described with reference to FIG. 2, and thus descriptions identical to those given above with reference to are omitted.

Referring to FIG. 9, the third switch 115 may be connected between the first node N1 and the third node N3. The resistor 114 may be connected between the third node N3 and the second node N2. A current flowing through the third switch 115 smaller than a current flowing through the first switch 112 due to the resistor 114. Accordingly, the internal intermediate voltage VIM may gradually decrease to the normal voltage (e.g., Vref2). When the internal intermediate voltage VIM reaches the normal voltage, the pulse width modulation control circuit 111 may turn off the third switch 115 and turn on the first switch 112 again.

Therefore, when the internal intermediate voltage VIM rises abnormally, the DC-DC converter 110*a* may control the output of the internal intermediate voltage VIM to gradually return to the normal voltage without interrupting the output of the internal intermediate voltage VIM. The power management integrated circuit 110 may supply the internal power supply voltage VINT to the main device 120 without interruption based on the internal intermediate voltage VIM.

Figure 10:
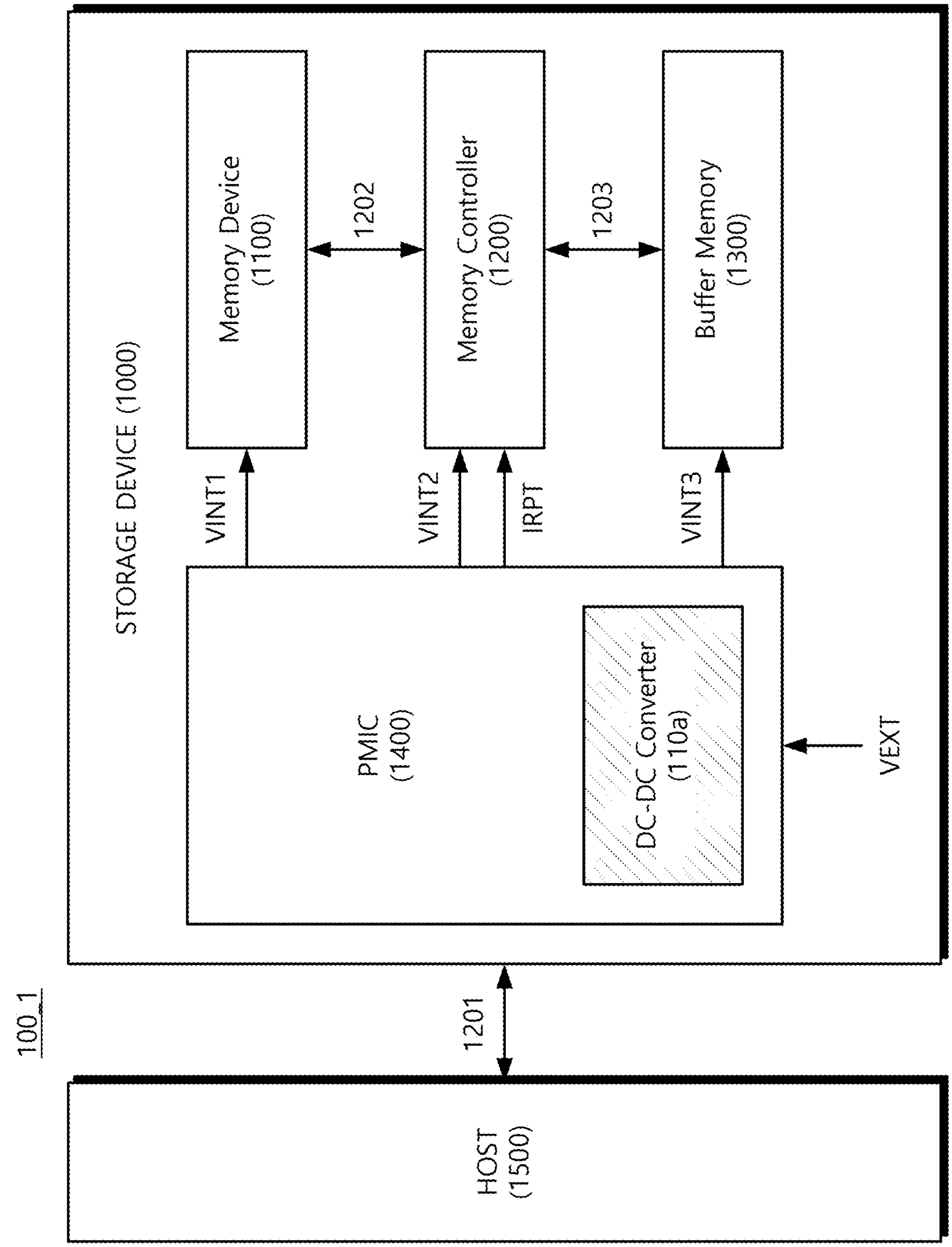
FIG. 10 is a block diagram illustrating a user device or a memory system according to an example embodiment.

FIG. 10 is a block diagram illustrating a user device or a memory system according to an example embodiment of the present disclosure. Referring to FIG. 10, a user device or a memory system 100_1 may include a storage device 1000 and a host 1500. The storage device 1000 and the host 1500 may be connected through a host interface 1201. The host interface 1201 may be a standard interface such as advanced technology attachment (ATA), serial ATA (SATA), parallel ATA (PATA), universal serial bus (USB), small computer systems interface (SCSI), enhanced small disk interface (ESDI), serial bus architecture IEEE 1394, interface design description (IDE) and/or card interface, or the like.

The storage device 1000 may be a storage device based on a non-volatile memory. For example, the storage device 1000 may include a memory device 1100, a memory controller 1200 and/or a buffer memory 1300. Additionally, the storage device 1000 may include a power management integrated circuit (PMIC) 1400. The power management integrated circuit 1400 may have the same or similar configuration and characteristics as the power management integrated circuit 110 illustrated in FIGS. 1 to 9.

The memory device 1100 may be a non-volatile memory such as a flash memory or phase change memory (PRAM). When the memory device 1100 is a flash memory, the storage device 1000 may be a flash storage device based on the flash memory. For example, the storage device 1000 may be an SSD, UFS and/or memory card, or the like. The buffer memory 1300 may include a volatile memory (for example, DRAM).

The memory device 1100 may be connected to the memory controller 1200 through a memory interface 1202. The memory device 1100 may include a memory cell array and a peripheral circuit. The peripheral circuitry may include all analog or digital circuits required to store or read data in the memory cell array.

The peripheral circuit may receive commands, addresses and data from the memory controller 1200, and store the data in the memory cell array according to control signals. Additionally, the peripheral circuit may read data stored in the memory cell array and provide the data to the memory controller 1200.

The memory cell array may include a plurality of memory blocks. Each memory block may have a vertical three-dimensional structure. Each memory block may include a plurality of memory cells. Multi-bit data may be stored in each memory cell. For example, the memory device 1100 may be a TLC flash memory capable of storing 3 bits of data in one memory cell.

The memory cell array may be located next to or above the peripheral circuit due to a design arrangement structure. The structure in which the memory cell array is located above the peripheral circuit is called a COP (cell on peripheral) structure. The memory cell array may be manufactured as a separate chip from the peripheral circuit. The upper chip including the memory cell array and the lower chip including the peripheral circuit may be connected to each other using a bonding method. This structure is called C2C (chip to chip) structure.

The memory controller 1200 may be connected between the memory device 1100 and the host 1500. Additionally, the memory controller 1200 may be connected between the buffer memory 1300 and the host 1500. The memory controller 1200 may control read or write operations of the memory device 1100 and/or the buffer memory 1300 in response to a request from the host 1500. The memory controller 1200 may receive host data from the host 1500 and provide the host data to the memory device 1100 and/or the buffer memory 1300.

The memory controller 1200 may include a control unit and a work memory. The control unit may control overall operations of the memory controller 1200. For example, the control unit may control a flash translation layer (FTL) to perform an address mapping operation. The control unit may be a commercially available or custom microprocessor.

The work memory may be a cache memory (for example, a static random access memory (SRAM)). The work memory may serve as a buffer memory that temporarily stores data. Additionally, the work memory may be a driving memory of the memory controller 1200. The work memory may drive the FTL.

The FTL may be firmware or a program for efficiently managing the memory device 1100. The memory device 1100 may not support an overwrite function different from a hard disk drive. Therefore, the memory device 1100 may perform the following process while updating data written to the page. First, the memory device 1100 may copy all valid data in a first memory block to which the written page belongs to an empty second memory block. Second, the memory device 1100 may erase the first memory block and make it an empty memory block. The memory device 1100 may perform a large number of page copy operations (for example, a page read operation and/or a page write operation) and erase operations while going through this process.

The FTL may be used between the host 1500 and the memory device 1100 to reduce the number of page copy and erase operations. The FTL may perform an address mapping function, a garbage collection function and a wear-leveling function, or the like. When an overwrite request is received from the host 1500, the address mapping function may write the corresponding data to another empty page instead of overwriting the original page, thereby reducing additional page copy and block erase operations. For this purpose, an address mapping table having a specified size may be maintained in the work memory and the buffer memory 1300. Through this, the FTL may manage an operation of mapping a logical address received from the host 1500 to a physical address in the memory device 1100.

The buffer memory 1300 may be connected to the memory controller 1200 through a buffer interface 1203. For example, the buffer memory 1300 may be used to temporarily store data to be stored in or read from the memory device 1100. Additionally, a cache area capable of storing cache data may be allocated to the buffer memory 1300. The buffer memory 1300 may be implemented with a DRAM, a SRAM, or the like. The buffer memory 1300 may be included in the memory device 1100 or the memory controller 1200.

The host 1500 may include a processor and a host memory. The processor and the host memory may be connected via an address/data bus. The host 1500 may be a personal digital assistance (PDA), a computer, a digital audio player, a digital camera, and/or a mobile phone, or the like. The host memory may be a non-volatile or volatile memory in the form of a cache, a read only memory (ROM), a programmable ROM (PROM), an erasable PROM (EPROM), an electrically EPROM (EEPROM), a flash, a SRAM, a DRAM, or the like.

The host memory may drive a plurality of software or firmware. For example, the host memory may drive an operating system (OS), applications, a file system, a memory manager, and I/O drivers, or the like.

The power management integrated circuit 1400 may provide internal power voltages to the memory device 1100, the memory controller 1200 and/or the buffer memory 1300 based on the external power supply voltage VEXT. For example, the power management integrated circuit 1400 may supply a first internal power supply voltage VINT1 to the memory device 1100. The power management integrated circuit 1400 may supply a second internal power supply voltage VINT2 to the memory controller 1200. The power management integrated circuit 1400 may supply a third internal power supply voltage VINT3 to the buffer memory 1300. The first internal power supply voltage VINT1, the second internal power supply voltage VINT2 and/or the third internal power supply voltage VINT3 may be set to be the same as or different from each other.

The power management integrated circuit 1400 may include a DC-DC converter 110*a*. The DC-DC converter 110*a* may generate an internal intermediate voltage (for example, the internal intermediate voltage VIM) based on the external power supply voltage VEXT. The power management integrated circuit 1400 may generate the first internal power supply voltage VINT1, the second internal power supply voltage VINT2 and/or the third internal power supply voltage VINT3 based on the internal intermediate voltage VIM. As an example, the power management integrated circuit 1400 may include a plurality of DC-DC converters 110*a* corresponding to each of the first internal power supply voltage VINT1, the second internal power supply voltage VINT2 and/or the third internal power supply voltage VINT3.

The DC-DC converter 110*a* may perform the pulse width modulation operation described in FIGS. 2 to 9 when the internal intermediate voltage exceeds a reference voltage (for example, the first reference voltage Vref1). Accordingly, even when the internal intermediate voltage increases abnormally, the memory device 1100, the memory controller 1200 and/or the buffer memory 1300 may be supplied with the internal power supply voltage without interruption.

In addition, when the internal intermediate voltage exceeds the reference voltage (for example, the first reference voltage Vref1), the DC-DC converter 110*a* (or the power management integrated circuit 1400) may transmit the interrupt signal IRPT to the memory controller 1200. The memory controller 1200 which receives the interrupt signal IRPT may preferentially move data remaining in the buffer memory 1300 to the memory device 1100. Therefore, the storage device 1000 may prevent a loss of data which is stored only in the buffer memory 1300.

Figure 11:
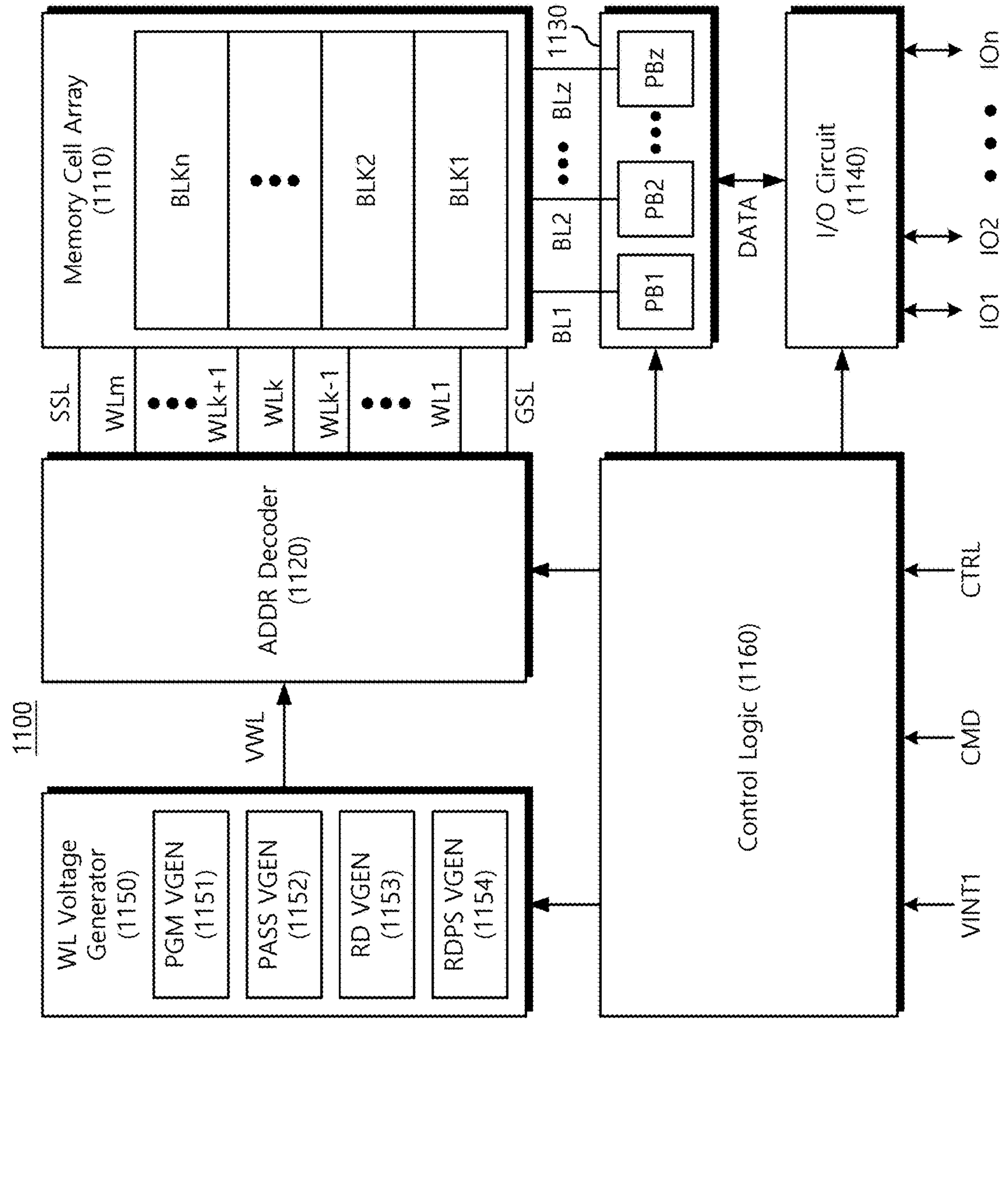
FIG. 11 is a block diagram illustrating a memory device of FIG. 10 according to an example embodiment.

FIG. 11 is a block diagram illustrating the memory device 1100 of FIG. 10 according to an example embodiment. The storage device 1000 of FIG. 10 may be a flash storage device based on flash memory. For example, the storage device 1000 may be implemented as an SSD, UFS and/or memory card, or the like.

Referring to FIGS. 10 and 11, the memory device 1100 may include a memory cell array 1110 and a peripheral circuit. The peripheral circuit may include an address decoder 1120, a page buffer circuit 1130, an input/output circuit 1140, a wordline voltage generator 1150 and control logic circuit 1160.

The memory cell array 1110 may include a plurality of memory blocks BLK1 to BLKn, n is a natural number equal to or greater than 2. Each memory block may be configured as a plurality of pages. Each page may include a plurality of memory cells. Each memory cell may store multi-bit data (for example, two or more bits). Each memory block may correspond to an erase unit and each page may correspond to a read or write unit.

The memory cell array 1110 may be formed in a direction perpendicular to a substrate. A gate electrode layer and an insulation layer may be alternately deposited on the substrate. Each memory block (for example, BLK1) may be connected to one or more string selection lines SSL, a plurality of wordlines WL1 to WLm, and one or more ground selection lines GSL. WLk is a selected wordline sWL and the remaining wordlines (WL1 to WLk−1, WLk+1 to WLm) are unselected wordlines uWL.

The address decoder 1120 may be connected to the memory cell array 1110 through selection lines SSL and GSL and wordlines WL1 to WLm, m is a natural number equal to or greater than 2. The address decoder 1120 may select a wordline during a program or read operation. The address decoder 1120 may receive a wordline voltage VWL from the wordline voltage generator 1150 and provide a program voltage or read voltage to the selected wordline.

The page buffer circuit 1130 may be connected to the memory cell array 1110 through bit lines BL1 to BLz, z is a natural number equal to or greater than 2. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The input/output circuit 1140 may be internally connected to the page buffer circuit 1130 through data lines and externally connected to the memory controller (refer to FIGS. 10, 1200) through the input/output lines IO1 to IOn. The input/output circuit 1140 may receive program data from the memory controller 1200 during a program operation. Also, the input/output circuit 1140 may provide data read from the memory cell array 1110 to the memory controller 1200 during a read operation.

The wordline voltage generator 1150 may receive internal power from the control logic circuit 1160 and generate the wordline voltage VWL required to read or write data. The wordline voltage VWL may be provided to a selected wordline sWL or unselected wordlines uWL through the address decoder 1120.

The wordline voltage generator 1150 may include a program voltage generator 1151 and a pass voltage generator 1152. The program voltage generator 1151 may generate a program voltage Vpgm provided to the selected wordline sWL during a program operation. The pass voltage generator 1152 may generate a pass voltage Vpass provided to the selected wordline sWL and the unselected wordlines uWL.

The wordline voltage generator 1150 may include a read voltage generator 1153 and a read pass voltage generator 1154. The read voltage generator 1153 may generate a select read voltage Vrd provided to the select wordline sWL during a read operation. The read pass voltage generator 1154 may generate a read pass voltage Vrdps provided to unselected wordlines uWL. The read pass voltage Vrdps may be a voltage sufficient to turn on memory cells connected to the unselected wordlines uWL during a read operation.

The control logic circuit 1160 may control operations such as read, write and erase of the memory device 1100 using commands CMD, addresses ADDR and control signals CTRL provided from the memory controller 1200. The addresses ADDR may include a block selection address for selecting one memory block, a row address for selecting one page and a column address for selecting one bit line. The control logic circuit 1160 may supply the internal power to each of components based on the first internal power supply voltage VINT1 received from the PMIC 1400.

Figure 12:
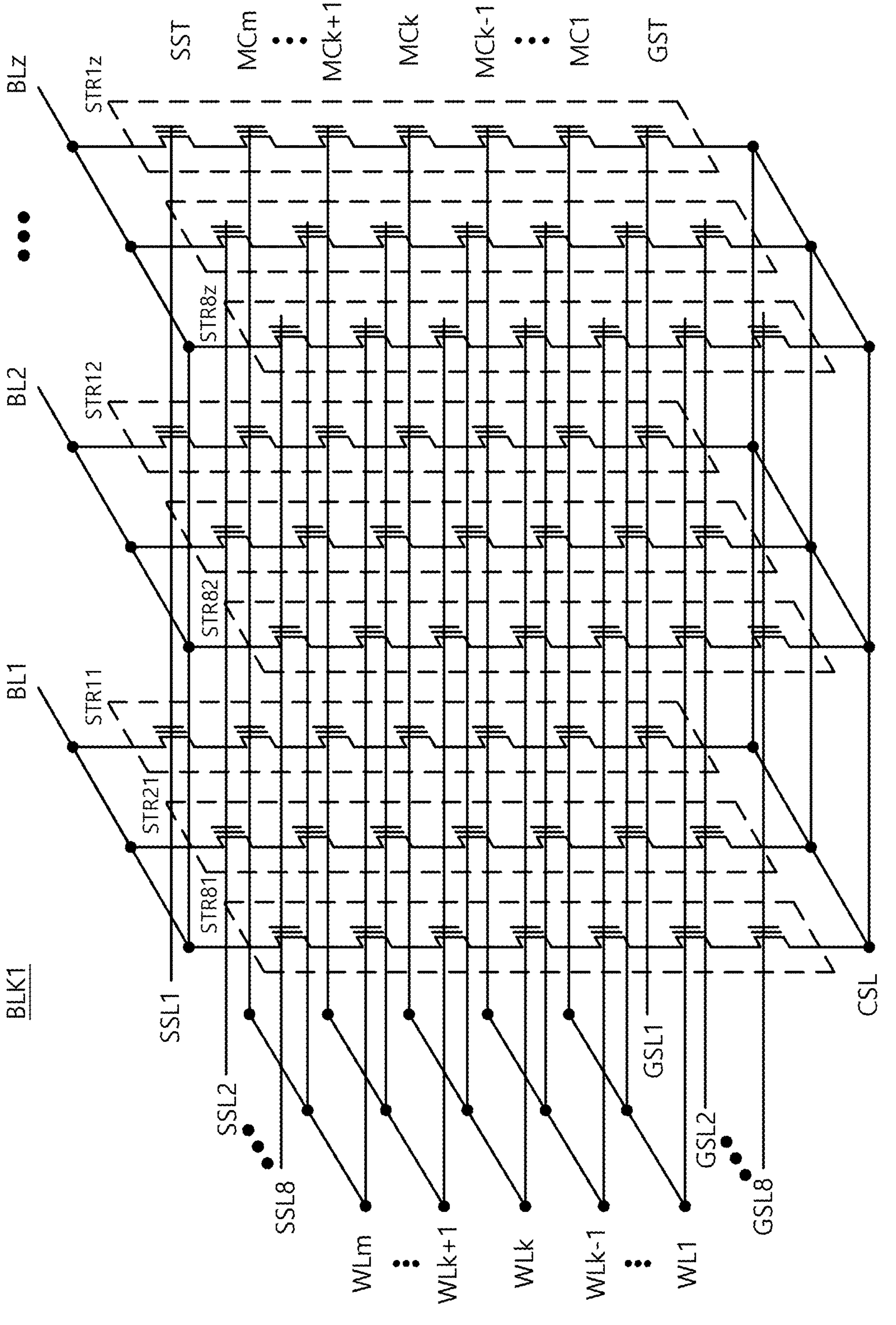
FIG. 12 is a circuit diagram illustrating an example embodiment of a memory block (BLK1) of the memory cell array described in FIG. 11.

FIG. 12 is a circuit diagram illustrating an example embodiment of a memory block BLK1 of the memory cell array illustrated in FIG. 11. Referring to FIG. 12, in the memory block BLK1, a plurality of cell strings STR11 to STR8*z* may be formed between the bit lines BL1 to BLz and a common source line CSL. Each cell string includes a string selection transistor SST, a plurality of memory cells MC1 to MCm and a ground selection transistor GST.

The string selection transistors SST may be connected to string selection lines SSL1 to SSL8, respectively. The ground selection transistors GST may be connected to ground selection lines GSL1 to GSL8, respectively. The string selection transistors SST may be connected to the bit lines BL1 to BLz, respectively, and the ground selection transistors GST may be connected to the common source line CSL.

The first to mth wordlines WL1 to WLm may be connected to the plurality of memory cells MC1 to MCm, respectively, in a row direction. The first to zth bit lines BL1 to BLz may be connected to the plurality of memory cells MC1 to MCm, respectively, in a column direction.

The first wordline WL1 may be placed above the first to eighth ground selection lines GSL1 to GSL8. The first memory cells MC1 which are placed at the same height from the substrate may be connected to the first wordline WL1. The mth wordline WLm may be placed below the first to eighth string selection lines SSL1 to SSL8. The mth memory cells MCm which are placed at the same height from the substrate may be connected to the mth wordline WLm. In a similar manner, the second to m-1th memory cells MC2 to MCm−1 which are placed at the same heights from the substrate may be respectively connected to the second to m-1th wordlines WL2 to WLm−1.

Figure 13:
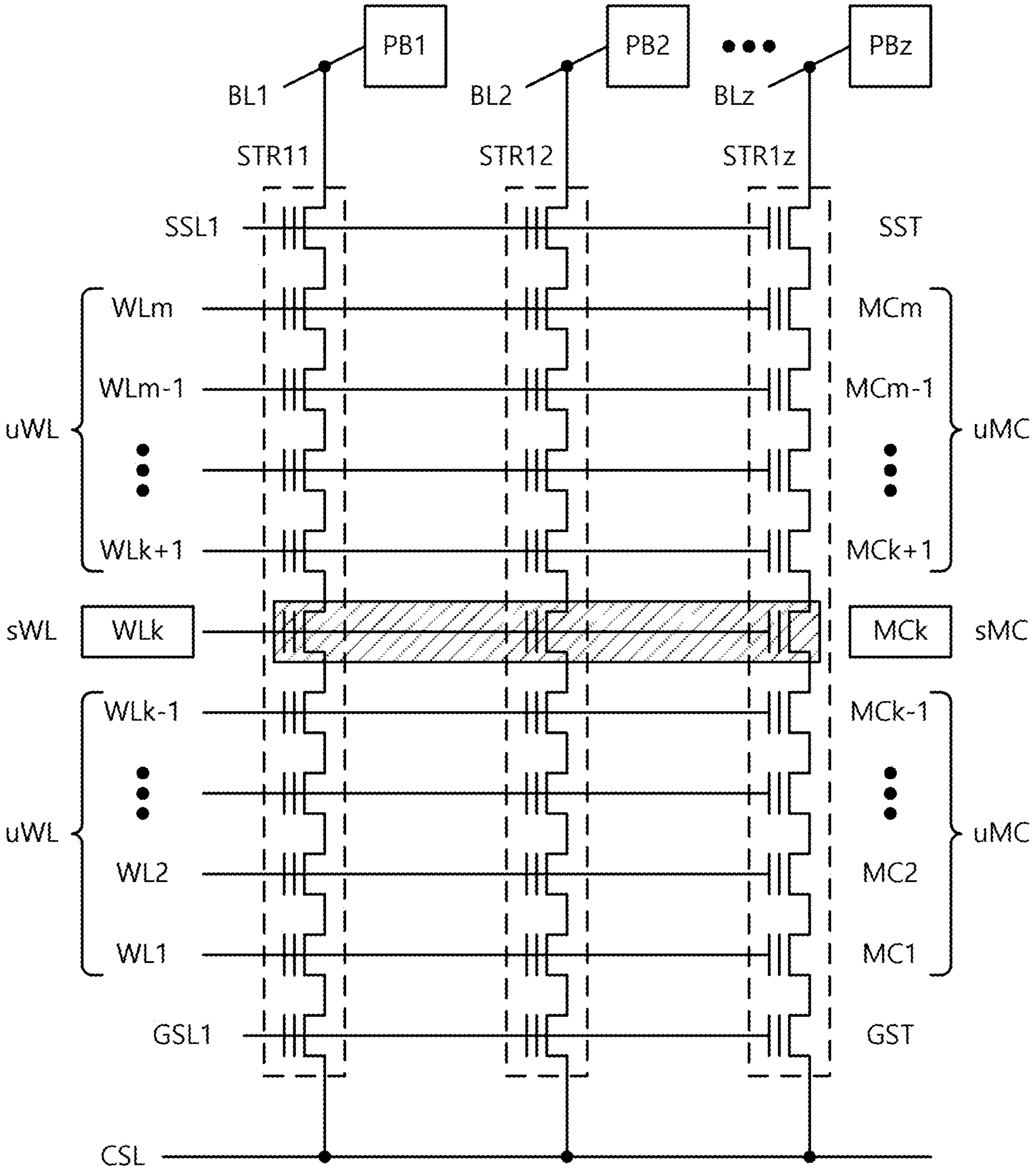
FIG. 13 is a circuit diagram illustrating cell strings selected by a first string selection line SSL1 among the cell strings of the memory block BLK1 described in FIG. 12.

FIG. 13 is a circuit diagram illustrating cell strings selected by the first string selection line SSL1 among the cell strings of the memory block BLK1 illustrated in FIG. 12. The 11th to 1zth cell strings STR11 to STR1*z* may be selected by the first string selection line SSL1. The 11th to 1zth cell strings STR11 to STR1*z* may be connected to the first to zth bit lines BL1 to BLz, respectively. First to zth page buffers PB1 to PBz may be connected to the first to zth bit lines BL1 to BLz, respectively.

The 11th cell string STR11 may be connected between the first bit line BL1 and the common source line CSL. The 11th cell string STR11 may include string selection transistors SST selected by the first string selection line SSL1, first to mth memory cells MC1 to MCm respectively connected to the first to mth wordlines WL1 to WLm, and ground selection transistors GST selected by the first ground selection line GSL1. The 12th cell string STR12 may be connected between the second bit line BL2 and the common source line CSL. The 1z cell string STR1*z* may be connected between the zth bit line BLz and the common source line CSL.

The first wordline WL1 and the mth wordline WLm may be edge wordlines (edge WL). The second wordline WL2 and the m-1th wordline WLm−1 may be edge adjacent wordlines (edge adjacent WL). The kth wordline WLk may be a selection wordline sWL. The k-1th wordline WLk−1 and the k+1th wordline WLk+1 may be adjacent wordlines (adjacent WL) located next to the selected wordline. When the kth wordline WLk is a selected wordline sWL, the remaining wordlines (WL1 to WLk−1 and WLk+1 to WLm) may be unselected wordlines uWL.

The first memory cells MC1 and the mth memory cells MCm may be edge memory cells (edge MC). The second memory cells MC2 and the m-1th memory cells MCm−1 may be edge adjacent memory cells (edge adjacent MC). The kth memory cells MCk may be selected memory cells sMC. The k-1th memory cells MCk−1 and the k+1th memory cells MCk+1 may be memory cells adjacent to the selected memory cells (hereinafter referred to as adjacent memory cells (adjacent MC)). When the kth memory cells MCk are selected memory cells sMC, the remaining memory cells MC1 to MCk−1 and MCk+1 to MCm may be unselected memory cells uMC.

A set of memory cells selected by one string selection line and connected to one wordline may be one page. For example, memory cells selected by the first string selection line SSL1 and connected to the kth wordline WLk may constitute one page. For example, eight pages may be configured in the kth wordline WLk. Among the eight pages, the page connected to the first string selection line SSL1 is a selected page, and the pages connected to the second to eighth string selection lines SSL2 to SSL8 are unselected pages.

Figure 14:
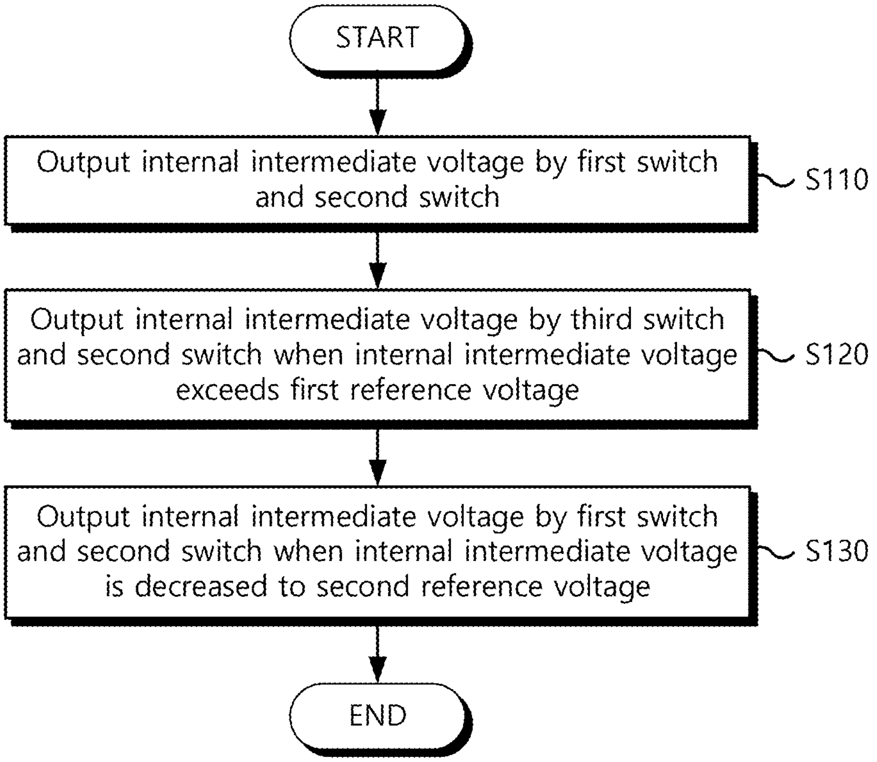
FIG. 14 is a flowchart illustrating a power management method of the storage device of FIG. 10 according to an example embodiment.

FIG. 14 is a flowchart illustrating a power management method of the storage device of FIG. 10 according to an example embodiment. Referring to FIGS. 2 to 10, the power management integrated circuit 1400 included in the storage device 1000 may include the DC-DC converter 110*a* described in FIGS. 2 to 9.

In operation S110, the DC-DC converter 110*a* of the power management integrated circuit 1400 may output the internal intermediate voltage VIM by repeatedly turning on and off the first switch 112 and the second switch 113. For example, in the normal state, the pulse width modulation control circuit 111 may stop or deactivate the third switching signal SW3, and output or activate the first switching signal SW1 and the second switching signal SW2. The DC-DC converter 110*a* may perform a pulse width modulation operation based on activation or output of the first switching signal SW1 and the second switching signal SW2. For example, the DC-DC converter 110*a* may perform the pulse width modulation operation by repeatedly turning on the first and second switches 112 and 113 based on activation of the first and second switching signals SW1 and SW2.

In the normal state, the first switch 112 may transmit the external power supply voltage VEXT to the second node N2. The second switch 113 may transmit the ground voltage to the second node N2. Accordingly, the second node N2 may output the specified internal intermediate voltage VIM. For example, in the normal state, the DC-DC converter 110*a* may output the internal intermediate voltage VIM having a level lower than the first reference voltage Vref1 and equal to or higher than the second reference voltage Vref2. In this case, the level of the internal intermediate voltage VIM may be in a normal state.

In operation S120, the DC-DC converter 110*a* of the power management integrated circuit 1400 may stop the first switch 112 and output the internal intermediate voltage VIM by the third switch 115 and the second switch 113 when the internal intermediate voltage VIM exceeds the first reference voltage Vref1. For example, when the internal intermediate voltage VIM abnormally rises above the first reference voltage Vref1, the pulse width modulation control circuit 111 may deactivate or stop the first switching signal SW1, and activate or output the third switching signal SW3 and the second switching signal SW2. For example, the pulse width modulation control circuit 111 may perform a pulse width modulation operation by repeatedly turning on and off the third switch 115 and the second switch 113 based on activation of the third switching signal SW3 and the second switching signal SW2. For example, the DC-DC converter 110*a* may perform the pulse width modulation operation by turning off the first switch 112 based on deactivation of the first switching signal SW1 and repeatedly turning on and off the second and third switches 113 and 115 based on activation of the second and third switching signals SW2 and SW3.

In this case, the third switch 115 may transfer a voltage lowered by the resistor 114 to the second node N2. Accordingly, the internal intermediate voltage VIM may gradually decrease.

In operation S130, when the internal intermediate voltage VIM decreases to the second reference voltage Vref2 lower than the first reference voltage Vref1, the power management integrated circuit 1400 may turn off the third switch 115 and output the internal intermediate voltage VIM again by repeatedly turning on and off the first switch 112 and the second switch 113. For example, the internal intermediate voltage VIM may be set to be maintained between the first reference voltage Vref1 and the second reference voltage Vref2. Accordingly, the pulse width modulation control circuit 111 may deactivate or stop the third switching signal SW3, and activate or output the first switching signal SW1 and the second switching signal SW2 again, so that the internal intermediate voltage VIM may not decrease any further. For example, the DC-DC converter 110*a* may perform again the pulse width modulation operation by turning off the third switch 115 based on deactivation of the third switching signal SW3 and repeatedly turning on and off the first and second switches 112 and 113 based on activation of the first and second switching signals SW1 and SW2. Therefore, the internal intermediate voltage VIM may be maintained in the normal state again.

Figure 15:
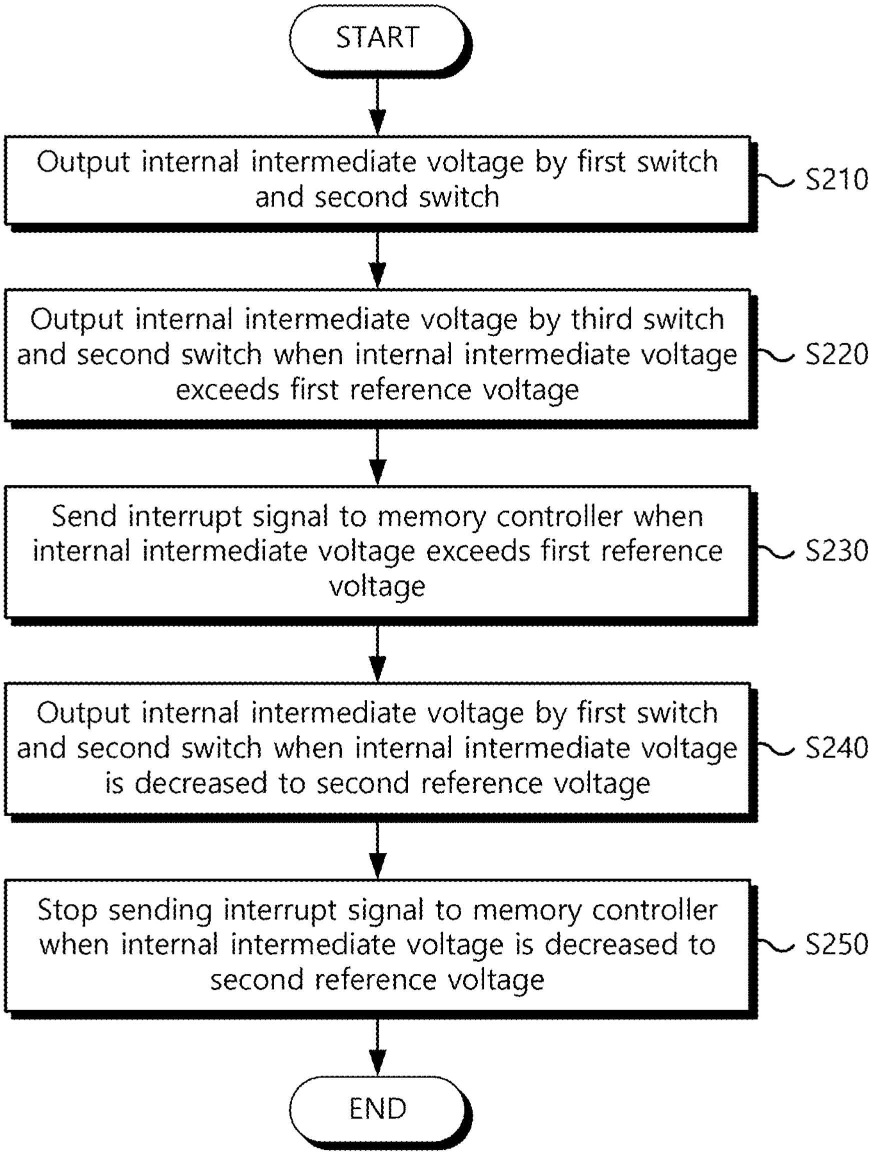
FIG. 15 is a flowchart illustrating a power management method of the storage device described in FIG. 10 according to an example embodiment.

FIG. 15 is a flowchart illustrating a power management method of the storage device described in FIG. 10 according to an example embodiment. Referring to FIGS. 2 to 10, the power management integrated circuit 1400 included in the storage device 1000 may include the DC-DC converter 110*a* described in FIGS. 2 to 9.

In operation S210, the power management integrated circuit 1400 may output the internal intermediate voltage VIM by repeatedly turning on and off the first switch 112 and the second switch 113. For example, in the normal state, the pulse width modulation control circuit 111 may stop or deactivate the third switching signal SW3, and output or activate the first switching signal SW1 and the second switching signal SW2. The DC-DC converter 110*a* may perform a pulse width modulation operation based on activation or output of the first switching signal SW1 and the second switching signal SW2.

In operation S220, the power management integrated circuit 1400 may turn off the first switch 112, and output the internal intermediate voltage VIM by the third switch 115 and the second switch 113 when the internal intermediate voltage VIM exceeds the first reference voltage Vref1. For example, when the internal intermediate voltage VIM abnormally rises above the first reference voltage Vref1, the pulse width modulation control circuit 111 may deactivate or stop the first switching signal SW1, and activate or output the third switching signal SW3 and the second switching signal SW2. For example, the pulse width modulation control circuit 111 may perform the pulse width modulation operation by repeatedly turning on and off the third switch 115 and the second switch 113 based on activation of the third switching signal SW3 and the second switching signal SW2.

In operation S230, the DC-DC converter 110*a* of the power management integrated circuit 1400 may transmit the interrupt signal IRPT to the memory controller 1200 when the internal intermediate voltage VIM exceeds the first reference voltage Vref1. For example, the memory controller 1200 may move data stored in the buffer memory 1300 to the memory device 1100 when receiving the interrupt signal IRPT.

In operation S240, the DC-DC converter 110*a* of the power management integrated circuit 1400 may turn off the third switch 115, and output the internal intermediate voltage VIM again by repeatedly turning on and off the first switch 112 and the second switch 113 when the internal intermediate voltage VIM decreases to the second reference voltage Vref2 lower than the first reference voltage Vref1. For example, the internal intermediate voltage VIM may be set to be maintained between the first reference voltage Vref1 and the second reference voltage Vref2. Accordingly, the pulse width modulation control circuit 111 may deactivate or stop the third switching signal SW3, and activate or output the first switching signal SW1 and the second switching signal SW2 again, so that the internal intermediate voltage VIM may not decrease any further. Therefore, the internal intermediate voltage VIM may be maintained in the normal state again.

In operation S250, the DC-DC converter 110*a* of the power management integrated circuit 1400 may stop transmitting the interrupt signal IRPT when the internal intermediate voltage VIM decreases to the second reference voltage Vref2. When the internal intermediate voltage VIM enters the normal state, the memory controller 1200 no longer needs to move data stored in the buffer memory 1300 to the memory device 1100.

According to the present disclosure, it may be possible to gradually adjust an internal voltage to a specified voltage when the internal voltage increases temporarily.

According to the present disclosure, it may be possible to prevent loss of data stored in a buffer memory even when the internal voltage increases temporarily.

While the present disclosure has been described with reference to embodiments thereof, it will be apparent to those of ordinary skill in the art that various changes and modifications may be made thereto without departing from the spirit and scope of the present invention as set forth in the following claims.

What is claimed is:

1. A power management integrated circuit comprising:

a DC-DC converter configured to generate an internal intermediate voltage based on an external power supply voltage, and output an internal power supply voltage based on the internal intermediate voltage, wherein the DC-DC converter comprises:

a first switch connected between a first node to which the external power supply voltage is applied and a second node from which the internal intermediate voltage is output, and configured to repeatedly turn on and off based on a first switching signal;

a second switch connected between the second node and a ground node, and configured to repeatedly turn on and off based on a second switching signal;

a resistor connected between the first node and a third node;

a third switch connected between the third node and the second node, and configured to repeatedly turn on and off based on a third switching signal;

a pulse width modulation control circuit configured to generate the first to third switching signals based on a level of the internal intermediate voltage; and a voltage distribution circuit connected between the second node and a fourth node, and configured to output the internal power supply voltage from the fourth node based on the internal intermediate voltage, wherein, when the internal intermediate voltage is lower than or equal to a first reference voltage, the DC-DC converter is configured to generate the internal intermediate voltage having a level between the first reference voltage and a second reference voltage lower than the first reference voltage by repeatedly turning on and off the first and second switches in response to activation of the first and second switching signals and turning off the third switch in response to deactivation of the third switching signal, and wherein, when the internal intermediate voltage exceeds the first reference voltage, the DC-DC converter is configured to decrease the internal intermediate voltage to the second reference voltage by repeatedly turning on and off the second and third switches in response to activation of the second and third switching signals and turning off the first switch in response to deactivation of the first switching signal.

2. The power management integrated circuit of claim 1, wherein the voltage distribution circuit includes:

an inductor connected between the second node and the fourth node, and a capacitor connected between the fourth node and the ground node.

3. The power management integrated circuit of claim 1, wherein, when the internal intermediate voltage is decreased to the second reference voltage by turning off the first switch, the DC-DC converter is configured to again generate the internal intermediate voltage having the level between the first reference voltage and the second reference voltage by repeatedly turning on and off the first and second switches in response to activation of the first and second switching signals and turning off the third switch in response to deactivation of the third switching signal.

4. The power management integrated circuit of claim 1, wherein the pulse width modulation control circuit is configured to block all of the first switching signal, the second switching signal and the third switching signal when the internal intermediate voltage exceeds a third reference voltage greater than the first reference voltage.

5. The power management integrated circuit of claim 1, wherein the first switch includes a drain connected to the first node, a source connected to the second node and a gate to which the first switching signal is input, wherein the second switch includes a drain connected to the second node, a source connected to the ground node and a gate to which the second switching signal is input, and wherein the third switch includes a drain connected to the third node, a source connected to the second node and a gate to which the third switching signal is input.

6. The power management integrated circuit of claim 5, wherein the pulse width modulation control circuit is configured to receive the internal intermediate voltage as a feedback signal.

7. The power management integrated circuit of claim 1, wherein the resistor includes a variable resistor, and wherein, when the internal intermediate voltage exceeds the first reference voltage, the pulse width modulation control circuit is configured to output a variable resistor control signal adjusting a resistance value of the variable resistor based on the level of the internal intermediate voltage.

8. The power management integrated circuit of claim 1, further comprising:

a variable resistor connected in parallel with the resistor between the first node and the third node, wherein, when the internal intermediate voltage exceeds the first reference voltage, the pulse width modulation control circuit is configured to output a variable resistor control signal adjusting a resistance value of the variable resistor based on the level of the internal intermediate voltage.

9. A storage device comprising:

a nonvolatile memory device including a plurality of memory cells;

a volatile memory device configured to temporarily store data stored in the plurality of memory cells of the nonvolatile memory device;

a memory controller configured to transfer the data between the nonvolatile memory device and the volatile memory device; and a power management integrated circuit configured to generate an internal intermediate voltage and output an internal power supply voltage to at least one of the nonvolatile memory device, the volatile memory device and the memory controller based on the internal intermediate voltage, wherein the power management integrated circuit includes a DC-DC converter comprising:

a first switch connected between a first node to which an external power supply voltage is applied and a second node from which the internal intermediate voltage is output, and configured to repeatedly turn on and off based on a first switching signal;

a second switch connected between the second node and a ground node, and configured to repeatedly turn on and off based on a second switching signal;

a resistor connected between the first node and a third node;

a third switch connected between the third node and the second node, and configured to repeatedly turn on and off based on a third switching signal;

a pulse width modulation control circuit configured to generate the first to third switching signals based on a level of the internal intermediate voltage; and a voltage distribution circuit connected between the second node and a fourth node, and configured to output the internal power supply voltage from the fourth node based on the internal intermediate voltage, wherein, when the internal intermediate voltage is lower than or equal to a first reference voltage, the DC-DC converter is configured to generate the internal intermediate voltage having a level between the first reference voltage and a second reference voltage lower than the first reference voltage by repeatedly turning on and off the first and second switches in response to activation of the first and second switching signals and turning off the third switch in response to deactivation of the third switching signal, and wherein, when the internal intermediate voltage exceeds the first reference voltage, the DC-DC converter is configured to decrease the internal intermediate voltage to the second reference voltage by repeatedly turning on and off the second and third switches in response to activation of the second and third switching signals and turning off the first switch in response to deactivation of the first switching signal.

10. The storage device of claim 9, wherein the pulse width modulation control circuit is configured to output an interrupt signal to the memory controller when the internal intermediate voltage exceeds the first reference voltage, and wherein the memory controller is configured to move data stored in the volatile memory device to the nonvolatile memory device based on activation of the interrupt signal.

11. The storage device of claim 10, wherein, when the internal intermediate voltage is decreased to the second reference voltage by turning off the first switch, the DC-DC converter is configured to again generate the internal intermediate voltage having the level between the first reference voltage and the second reference voltage by repeatedly turning on and off the first and second switches in response to activation of the first and second switching signals and turning off the third switch in response to deactivation of the third switching signal.

12. The storage device of claim 11, wherein the pulse width modulation control circuit is configured to output the interrupt signal to be activated when the internal intermediate voltage exceeds the first reference voltage and to be deactivated when the internal intermediate voltage is decreased to the second reference voltage.

13. The storage device of claim 9, wherein the resistor includes a variable resistor, and wherein, when the internal intermediate voltage exceeds the first reference voltage, the variable resistor is configured to be adjusted a resistance value of the variable resistor in response to a variable resistor control signal.

14. The storage device of claim 13, wherein the variable resistor is disposed outside the power management integrated circuit, and wherein the memory controller is configured to output the variable resistor control signal, or wherein the pulse width modulation control circuit is configured to output the variable resistor control signal.

15. The storage device of claim 9, further comprising:

a variable resistor connected in parallel with the resistor between the first node and the third node, wherein, when the internal intermediate voltage exceeds the first reference voltage, the pulse width modulation control circuit is configured to output a variable resistor control signal adjusting a resistance value of the variable resistor based on the level of the internal intermediate voltage.

16. A power management method of a storage device, the method comprising:

generating an internal intermediate voltage having a level between a first reference voltage and a second reference voltage lower than the first reference voltage by repeatedly turning on and off a first switch connected to an external power supply voltage and repeatedly turning on and off a second switch connected to a ground voltage;

when the internal intermediate voltage exceeds the first reference voltage, decreasing the internal intermediate voltage by repeatedly turning on and off the second switch and a third switch connected to the external power supply voltage through a resistor and by turning off the first switch;

when the internal intermediate voltage is decreased to the second reference voltage, generating the internal intermediate voltage again having the level by repeatedly turning on and off the first switch and the second switch and by turning off the third switch; and generating an internal power supply voltage based on the internal intermediate voltage and outputting the internal power supply voltage to at least one of a nonvolatile memory device, a volatile memory device and a memory controller, wherein the generating of the internal intermediate voltage is performed based on the external power supply voltage and a level of the internal intermediate voltage.

17. The method of claim 16, further comprising:

transmitting an interrupt signal to the memory controller when the internal intermediate voltage exceeds the first reference voltage; and moving data stored in the volatile memory device to the nonvolatile memory device in response to the interrupt signal.

18. The method of claim 17, further comprising:

stopping transmission of the interrupt signal when the internal intermediate voltage is decreased to the second reference voltage after exceeding the first reference voltage.

19. The method of claim 16, wherein a current flowing capacity of the third switch is smaller than or equal to a current flowing capacity of the first switch.

20. The method of claim 16, wherein the resistor includes a variable resistor, and wherein the decreasing of the internal intermediate voltage includes adjusting a resistance value of the variable resistor based on the level of the internal intermediate voltage.

* * * * *